(12) United States Patent
Joshi et al.

(10) Patent No.: US 9,729,193 B2
(45) Date of Patent: Aug. 8, 2017

(54) WIRELESS SENSOR PLATFORM

(71) Applicant: UT-Battelle, LLC, Oak Ridge, TN (US)

(72) Inventors: Pooran C. Joshi, Knoxville, TN (US); Stephen M. Killough, Knoxville, TN (US); Phani Teja Kuruganti, Knoxville, TN (US)

(73) Assignee: UT-Battelle, LLC, Oak Ridge, TN (US)

( * ) Notice: Subject to any disclaimer, the term of this patent is extended or adjusted under 35 U.S.C. 154(b) by 106 days.

(21) Appl. No.: 14/538,219

(22) Filed: Nov. 11, 2014

(65) Prior Publication Data

US 2016/0134327 A1    May 12, 2016

(51) Int. Cl.
| | | |
|---|---|---|
| *G01V 3/00* | (2006.01) | |
| *H04B 1/707* | (2011.01) | |
| *H04L 23/02* | (2006.01) | |
| *H05K 3/12* | (2006.01) | |
| *H05K 1/09* | (2006.01) | |

(Continued)

(52) U.S. Cl.
CPC ............ *H04B 1/707* (2013.01); *H04L 23/02* (2013.01); *H05K 1/097* (2013.01); *H05K 1/118* (2013.01); *H05K 1/165* (2013.01); *H05K 3/125* (2013.01); *H05K 2201/015* (2013.01); *H05K 2201/0145* (2013.01); *H05K 2201/0154* (2013.01); *H05K 2201/09263* (2013.01); *H05K 2201/10098* (2013.01)

(58) Field of Classification Search
CPC ........ H04B 1/707; H05K 3/30; H05K 3/1225; H05K 3/32; H05K 3/125; H05K 1/097; H05K 1/118; H05K 1/105; H05K 2201/0145; H05K 2201/015; H05K 2201/0154; H05K 2201/09263; H05K 2201/10098; H04L 27/20; H05L 23/02
USPC ...................................................... 340/856.3
See application file for complete search history.

(56) References Cited

U.S. PATENT DOCUMENTS

| | | |
|---|---|---|
| 5,571,944 A | 11/1996 | Pfeifer et al. |
| 6,579,660 B1 | 6/2003 | Figov |

(Continued)

FOREIGN PATENT DOCUMENTS

CN    1012012798    10/2010

OTHER PUBLICATIONS

Gold code—Wikipedia, the free encyclopedia [retrieved Aug. 27, 2016], Retrived from Internet: <URL: http://en.wikipedia.org/wiki/Gold code>.*

(Continued)

*Primary Examiner* — Nader Bolourchi
(74) *Attorney, Agent, or Firm* — Fox Rothschild LLP; Robert J. Sacco; Carol E. Thorstad-Forsyth

(57) ABSTRACT

A wireless sensor platform and methods of manufacture are provided. The platform involves providing a plurality of wireless sensors, where each of the sensors is fabricated on flexible substrates using printing techniques and low temperature curing. Each of the sensors can include planar sensor elements and planar antennas defined using the printing and curing. Further, each of the sensors can include a communications system configured to encode the data from the sensors into a spread spectrum code sequence that is transmitted to a central computer(s) for use in monitoring an area associated with the sensors.

18 Claims, 17 Drawing Sheets

(51) Int. Cl.
H05K 1/11 (2006.01)
H05K 1/16 (2006.01)

(56) References Cited

U.S. PATENT DOCUMENTS

| | | | |
|---|---|---|---|
| 6,771,071 B1* | 8/2004 | Wright | G01R 33/3415 324/318 |
| 6,967,362 B2 | 11/2005 | Nam et al. | |
| 7,220,936 B2 | 5/2007 | Ott et al. | |
| 7,411,494 B2* | 8/2008 | Kates | G08B 1/08 340/13.31 |
| 7,832,263 B2 | 11/2010 | Rensel et al. | |
| 8,917,159 B2* | 12/2014 | McAllister | G06Q 10/087 340/10.51 |
| 2003/0035558 A1 | 2/2003 | Kawamura et al. | |
| 2003/0161411 A1* | 8/2003 | McCorkle | G01S 7/023 375/295 |
| 2005/0160821 A1 | 7/2005 | Cunningham et al. | |
| 2005/0281318 A1* | 12/2005 | Neugebauer | H04B 1/707 375/134 |
| 2006/0000285 A1 | 1/2006 | Edmonson et al. | |
| 2006/0121182 A1* | 6/2006 | Kalyanasundaram | H05K 3/12 427/58 |
| 2006/0292777 A1* | 12/2006 | Dunbar | H01L 21/02554 438/197 |
| 2007/0007851 A1 | 1/2007 | Loebl et al. | |
| 2009/0315777 A1* | 12/2009 | Baughman | G01S 5/04 342/457 |
| 2010/0245114 A1 | 9/2010 | Celik-Butler et al. | |
| 2010/0272158 A1* | 10/2010 | Lakkis | H04B 1/707 375/146 |
| 2011/0077490 A1* | 3/2011 | Simpson | A61B 5/14532 600/345 |
| 2011/0087080 A1 | 4/2011 | Schroter | |
| 2011/0263036 A1 | 10/2011 | Blauw et al. | |
| 2012/0050114 A1* | 3/2012 | Li | H01Q 1/2266 343/702 |
| 2012/0282594 A1 | 11/2012 | Chen et al. | |
| 2013/0023795 A1* | 1/2013 | Stein | G06Q 50/24 600/587 |
| 2013/0040573 A1* | 2/2013 | Hillyard | H04W 8/005 455/41.2 |
| 2013/0093597 A1* | 4/2013 | Stolpman | G01V 3/38 340/854.3 |
| 2013/0337190 A1 | 12/2013 | Ramanujan et al. | |
| 2014/0056333 A1* | 2/2014 | Neff | H04B 1/7073 375/149 |
| 2014/0111953 A1* | 4/2014 | McClure | G06F 3/044 361/749 |
| 2014/0220724 A1* | 8/2014 | Duty | H01L 21/02521 438/69 |
| 2015/0003499 A1* | 1/2015 | Boutillon | H04L 27/2003 375/146 |
| 2015/0016487 A1* | 1/2015 | Britton | G01K 1/20 374/185 |
| 2015/0156819 A1* | 6/2015 | Kielar | H05B 3/20 219/509 |

OTHER PUBLICATIONS

Inverted-F antenna—Wikipedia, the free encyclopedia [retrieved Aug. 27, 2016], Retrieved from Internet: <URL: http://en.wikipedia.org/wiki/Inverted-F antenna>.*
feedback shift register—Wikipedia, the free encyclopedia [retrieved Aug. 27, 2016], Retrieved from Internet: <URL: http://en.wikipedia.org/wiki/feedback shift register>.*
Stan Farnsworth, "Novacentrix PulseForge TM Curing Copper and other Thin-Film Materials at Production Speeds," Oct. 2009, Available online: http://www.aimcal.org/uploads/4/6/6/9/46695933/farnsworth.pdf.*
"Novacentrix Printed Electronics Product Leadership," Available online: <https://www.novacentrix.com/products/overview>, Jun. 19, 2012, <https://web.archive.org/web/*/https://www.novacentrix.com/products/overview>.*
"Novacentrix Inkjet Starter Kits" online: <https://www.novacentrix.com/products/inkjet-starter-kits>.*
"Pulse thermal processing—Excellence in Technology Transfer 2013," FLC Southeast Region, Available online: https://www.federallabs.org/index.php?tray=award_detail&cid=FLCawrd743&tid=1FLtop123>.*
Tsai et al., "Kasami code-shift-keying modulation for ultra-wideband communication systems", IEEE Trans on Communications (Jun. 2007) 55(6): 1242-1252.
Ver-Bruggen et al., "Humidity sensors designed for buildings seek commercial opportunities", Web. (Aug. 1, 2012).
Virtanen et al., "Inkjet-printed humidity sensor for passive UHF RFID systems", IEEE Trans. on Instrumentation and Measurement (Aug. 2011) 60(8): 2768-2777.
Wang et al., "An all-printed wireless humidity sensor label", Dept of Science and Technology (ITN), Linkping University, SE-601 74, Sweden.
International Search Report and Written Opinion dated Nov. 18, 2016 for International Patent Application No. PCT/US2016/048577.

* cited by examiner

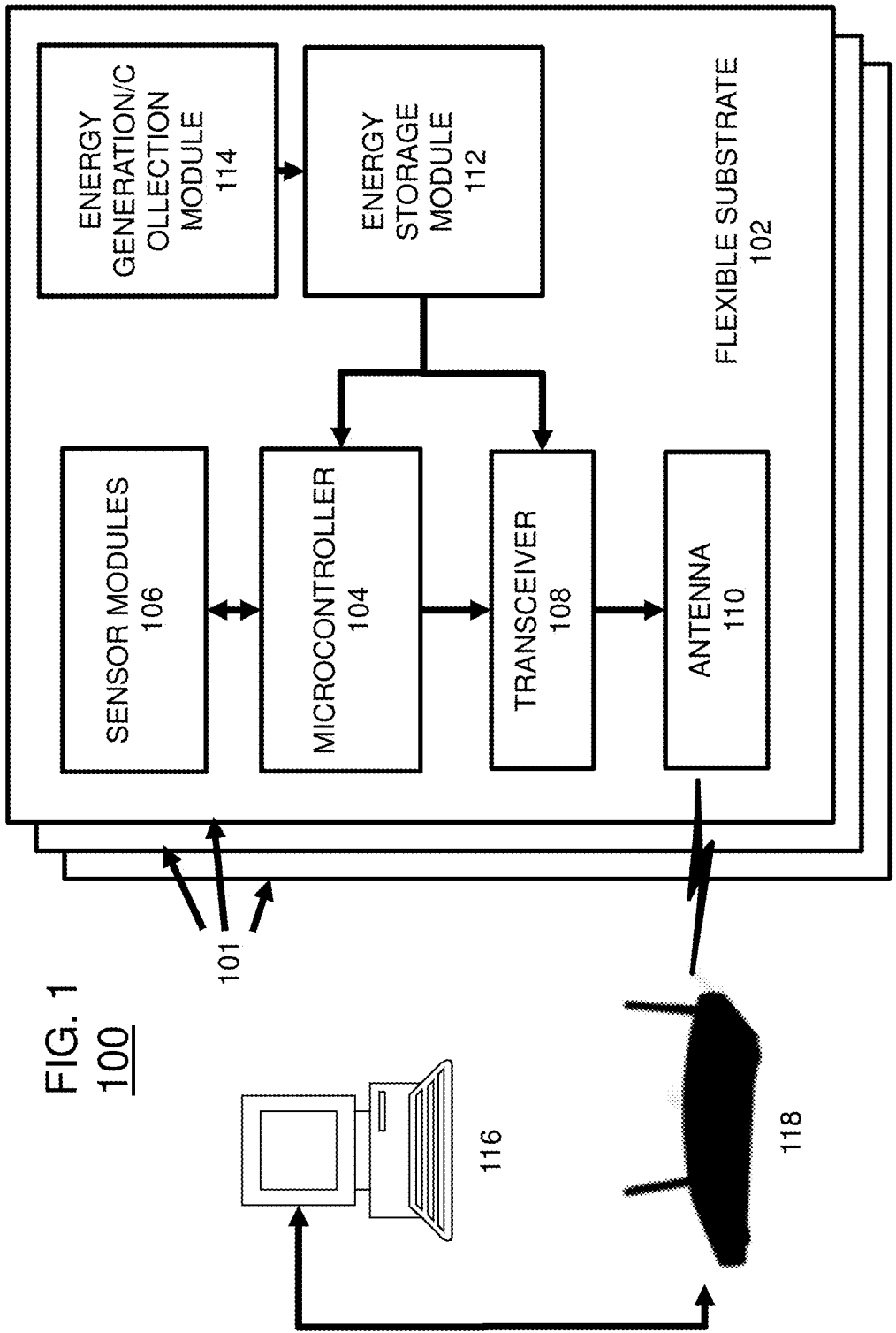

TO TRANSCEIVER

400

500

800

WIRELESS SENSOR PLATFORM

STATEMENT REGARDING FEDERALLY SPONSORED RESEARCH AND DEVELOPMENT

This invention was made with government support under Contract No. DE-AC05-00OR22725 awarded by the U.S. Department of Energy. The government has certain rights in the invention.

FIELD OF THE INVENTION

The present invention relates to wireless sensors, and more specifically to methods for fabricating sensors for a wireless platform and devices therefrom.

BACKGROUND

Buildings consume up to 40% of the energy produced in the United States. Accordingly, the use of sensors and controls has been studied in order to reduce the energy consumption of buildings. In particular, such sensor and controls can be used to measure energy usage and efficiently control building systems. For example, sensors can be used in buildings to provide the information necessary for optimal control of heating, ventilation, and air-conditioning (HVAC) and lighting systems. Unfortunately, installation and wiring costs for conventional sensors are quite high, making it cost-prohibitive for building managers to deploy large quantities of advanced sensors, especially in the case of existing buildings. To reduce the costs associated with wiring, wireless sensors have been proposed. Wireless sensors have the unique advantage of being suitable for easily retrofitting existing buildings at a minimal labor cost, and the flexibility to be placed at optimal observable locations. However, the cost associated with the production of wireless sensors is still non-trivial.

SUMMARY

Embodiments of the invention concern a wireless sensor platform. In a first, embodiment, a sensor device is provided that includes a flexible substrate having at least one surface that is electrically insulating and a plurality of components disposed on the at least one surface. The plurality of components include a communications system, at least one sensor device communicatively coupled to the communications system, and at least one antenna electrically coupled to the communications system. In the sensor device, each of the at least one sensor and the at least one antenna is a planar device and the communications system is configured for receiving sensor signals from the at least one sensor, encoding the sensor signals into a bit sequence via code shift keying using a spread spectrum coding, and transmitting the bit sequence.

In one configuration of the sensor device, the communications system is configured for performing the encoding by combining at least a portion of the sensor signals into an n-bit word and generating the bit sequence using a linear feedback shift register (LFSR) using the n-bit word as a seed, where a feedback arrangement for the LFSR is selected to provide a Gold code.

In another configuration of the sensor device, the communications system is configured for performing the encoding by combining at least a portion of the sensor signals into a plurality of n-bit words and generating the bit sequence via an exclusive-ORing of the output of a plurality of linear feedback shift registers (LFSRs), where each of the plurality LFSRs uses one of the plurality n-bit words as a seed and where a feedback arrangement for the plurality of LFSRs is selected to provide a Gold code.

In some configurations of the sensor device, the at least one antenna is one of an inverted F-antenna or a L-shaped antenna.

In some configurations, the at least one sensor is at least one of a resistive temperature sensor, a capacitive humidity sensor, or a resistive strain gauge sensor. Further, each of the at least one sensor can be one of an active sensor or a passive sensor.

In some configurations, the at least one sensor can include a plurality of printed features. The plurality of printed features can be printed lines with a linewidth between about 1 μm and 500 μm, such as 100 μm. Further, the plurality of printed features can be disposed over at least two of the at least one surface.

In a second embodiment of the invention, there is provided a method of fabricating a sensor device. The method includes providing a flexible substrate having at least one surface that is electrically insulating and forming at least one planar sensor and at least one antenna on the surface using at least one additive process. The method also includes mounting one or more discrete components on the surface and electrically coupling the communications system to the at least one planar sensor and the at least one antenna. As a result, the discrete components define at least a communications system for receiving sensor signals from the at least one planar sensor and for transmitting a bit sequence based on the sensor signals via the at least one antenna. In the method, the at least one additive process includes a depositing of at least one material and a curing of the at least one material and the curing is selected so as to limit thermal damage to the flexible substrate.

In the method, the flexible substrate can be selected to be at least one of paper, a plastic, glass, or a fabric.

In the method, the depositing of the at least one material can include performing a printing process, for each of the at least one material, where the printing process can be at least one of an inkjet printing process, a stencil printing process, or screen printing process. In some configurations, the printing process is configured to provide linewidths between about 1 μm and 500 μm, such as 100 μm. In other configurations, the printing process can be a multi-pass printing process, and wherein each pass of the multi-pass printing process is selected to add a height between about 0.1 μm and 10 μm.

In the method, the curing of the at least one material can include performing a low thermal budget curing process. Further, performing the low thermal budget curing process can include performing pulse thermal processing (PTP) curing process for providing at least one pulse of thermal energy. In the PTP process, the at least one pulse can be selected to have a peak pulse energy of up to 20 kW/cm² and a pulse width between about 20 microseconds and 20 milliseconds. Further, the at least one pulse can be ramped up or down using at least one step.

In some implementations, performing the PTP curing process can consist of applying the at least one pulse using a broadband PTP spectrum source. Additionally, a filtering the broadband PTP spectrum source can be performed.

BRIEF DESCRIPTION OF THE DRAWINGS

FIG. 1 is a block diagram illustrating a configuration for a wireless sensor platform that includes one or more wireless sensors in accordance with the various embodiments;

DETAILED DESCRIPTION

Figure 2A:
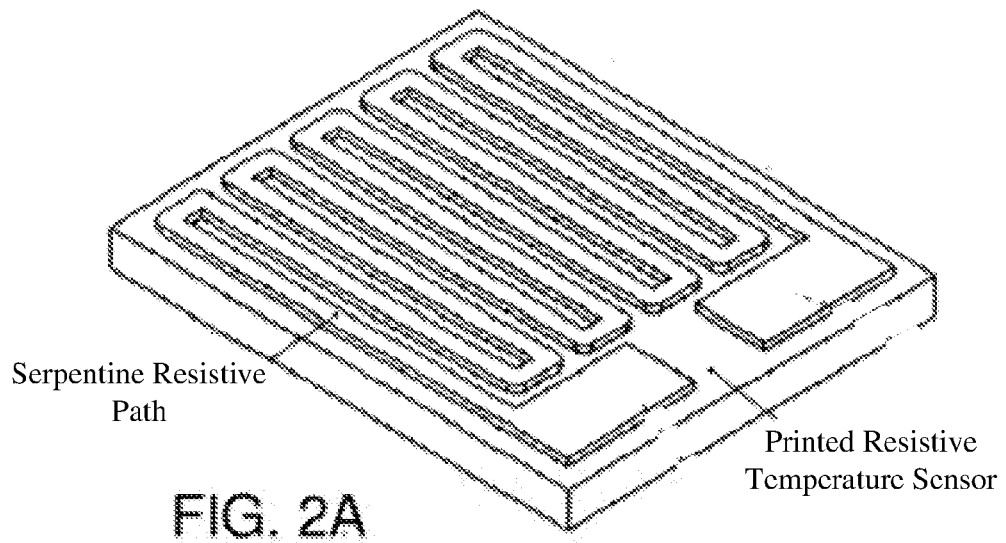
FIG. 2A shows one exemplary configuration for a printed resistive temperature sensor element in accordance with the various embodiments.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

As noted above, wireless sensors have the unique advantage of being suitable for easily retrofitting existing buildings at a minimal labor cost, and the flexibility to be placed at optimal observable locations. Unfortunately, as noted above, such wireless sensors are typically associated with significant costs. In particular, the technologies typically utilized for fabrication of wireless sensor devices generally require relatively complex manufacturing processes. One such technology is printed circuit board (PCB) technology. PCB technologies are relatively mature and reliable, but requires a complex photolithography method to form metal lines on each level of the PCB. Further, PCB-based sensors have other several disadvantages or drawbacks. For example, PCB-based sensors are typically designed for placement on substantially flat surfaces, limiting their placement to such locations or requiring some type of casing or enclosure to conform the other types of surfaces. Further, PCB-based sensors will typically require such an enclosure or housing anyways, even when placed on flat surfaces, adding further weight and bulk to the sensors. Accordingly, PCB-based sensors and other conventional sensor technologies are not ideal for all circumstances.

In view of the limitations of existing sensor systems, the various embodiments are directed to a new sensor platform utilizing printable electronics on flexible substrates and including a low power communications system. The key characteristics of the platform are as follows.

Integration. The integration of sensors on flexible substrates (e.g., paper, plastic, fabric, etc.) can be performed in the various embodiments using 2D or 3D additive manufacturing techniques with such flexible substrates. For example, roll-to-roll manufacturing using inkjet printing, screen-printing, or slot-die coating, to name a few. Any dielectric, semiconductor, and metal layers need for the sensor can be printed on flexible substrates with feature sizes (line width and resolution) as small as 1 µm. A 5 µm printing technology is currently available. The dielectric, semiconductor, or metal layers can be exposed to radiation for high temperature annealing at low thermal budgets suitable for flexible substrate integration. In one embodiment, the radiation fluence can be as high as 20 kW/cm$^2$ while the processing time can be as short as 20 µs. In other configurations, laser radiation can be utilized for low thermal budget curing. The laser processing will further reduce the processing time to nano-seconds. The laser processing time can be in the range of 0.1-100 nano-seconds for a single pulse. In some embodiments, multiple pulses can be used to get the desired properties. However, some laser processing technique may not be compatible with large area roll-to-roll manufacturing platforms.

The integrated sensor platform can be battery powered and rechargeable. For example, a thin-film battery with capacity of 1-10 mAH can be provided and photovoltaic cells can be incorporated onto the flexible substrate to charge the battery. Any photovoltaic cell technology offering at least 5% efficiency would be suitable for most embodiments. However, in some embodiments, lower efficiencies could be suitable depending on the power requirements of the components in the sensor platform.

Sensors. The flexible sensor can be of capacitive and resistive types. The capacitive relative humidity sensors can have a capacitance in the range of 1-1000 pF. The resistive temperature sensors can have a resistance in the range of 1-100 kn. The sensors can be cascaded for enhanced sensitivity and accuracy. Printable temperature (sensitivity: $1.02 \times 10^{-3}/°$ C.) and humidity (sensitivity: 0.50 pF/% RH) sensors with usable accuracy can be fabricated using any electrically conductive inks. For example, such inks can include, but are not limited to, commercially available silver, copper, or gold nanoparticle-based inks. The flexible sensors can be co-integrated on a single platform or fit into a pick-and-place arrangement to add discrete components to the flexible substrate.

Communications. In the various embodiments, low power wireless communications can be achieved via a printable inverted-F antenna. Such an antenna can be fabricated using any electrically conductive inks. For example, such inks can include, but are not limited to, commercially available metal (e.g., silver, copper, gold) nanoparticle inks. Such an antenna can be utilized to provide communications at various frequencies. In some embodiments, these can include communications at 5.8 GHz, 2.4 GHz, 900 MHz, and 433 MHz. However, the various embodiments are not limited to the above-identified frequencies. In addition, the communication scheme used in the various embodiments is a spread spectrum-based code shift keying with low peak-power requirements. In some configurations, at little as 4 mA may be required for data transmission. This approach provides ten-fold improvement in power requirements and battery consumption compared to a quadrature phase shift keying (QPSK).

Wireless Sensor Components

Now that some basic features of the sensor platform have been described, the disclosure turns to FIGS. 1 to 3C to illustrate the various features of a sensor platform in accordance with the various embodiments.

FIG. 1 is a block diagram illustrating a configuration for a wireless sensor platform 100 that includes one or more wireless sensors 101 in accordance with the various embodiments. Although only three instances of wireless sensor 101 are illustrated in FIG. 1, it is contemplated that wireless sensor 101 can be provided any number of times and at any number of locations of interest. Each of wireless sensors 101 includes a flexible substrate 102 for supporting various components. The various components can include a microcontroller 104 for controlling and coordinating operation of the various components, sensor modules 106 for generating sensor signals, a transceiver 108 and an antenna 110 for transmitting data based on the sensor signals from sensor module 106, an energy storage module 112 for providing power for the microcontroller 104 and the transceiver 108, and an energy generation/collection module 114 for recharging the energy storage module 112. In operation, the wireless sensor can wireless communication with a central computing device 116, which can be used to monitor the data from wireless sensors 101 and, if necessary, be configured to create alerts for users or automatically take actions. This can be a direct communication or, as shown in FIG. 1, one or more wireless base stations 118 can be provided to wireless communication with each wireless sensor 101 to provide communications with central computing device 116. Wiring between the various components of the wireless sensor can be provided, at least in part, via printing of electrical lines, described in greater detail below.

The flexible substrate 102 can be fabricated from various types of materials. As noted above, these materials can include paper, plastic, glass, and fabric, to name a few. Paper materials can include, for example, cellulosic substrates designed for printing electronic circuits thereon, such as POWERCOAT paper available from Arjowiggins SAS of France. Fabric materials can include, for example, cotton, polytetrafluoroethylene (PTFE) and other fluoropolymer-based materials (e.g., materials sold under the GORE-TEX brand registered to W.L. Gore and Associates of Newark, Del., and synthetic rubbers (e.g., neoprene). Plastic materials can include polyimide films. For example, films fabricated from KAPTON film available from E. I. du Pont de Nemours and Company of Wilmington, Del. The advantage of such polyimide films being that they are relatively stable across a wide range of temperatures to provide relatively wide processing conditions and to be suitable for various environments. For example, in the case of a KAPTON film, it is stable from about −269° C. to about 400° C. Another advantage of such polyimide films is that they have generally good dielectric properties, thus making it suitable for maintaining isolation between electrical components formed or placed thereon. However, the various embodiments are not limited solely to forming the flexible substrate from KAPTON films or any other polyimide films. Rather, numerous other types of plastics can be utilized. By way of example and not by way of limitation, other suitable plastics include polyethyleneterephthalate (PET), polycarbonate (PC), acrylonitrile butadiene styrene (ABS), polyethersulfone (PES), polyethylene naphthalate (PEN), polyarylate (PAR), and polyetheretherketone (PEEK).

Although various types of materials are specifically identified above, the various embodiments are not limited to solely the above-identified material and any other materials suitable for providing a flexible substrate can be utilized without limitation.

The microcontroller 104 can be an integrated circuit microcontroller. In some embodiments, the microcontroller 104 can be an application specific integrated circuit specifically designed for the particular configuration of the wireless sensor platform 100. However, in other embodiments, a general purpose microcontroller integrated circuit chip can also be utilized and programmed for the particular configuration of the wireless sensor platform 100. For example, in one particular embodiment, a PCI16F684 programmable microcontroller, available from Microchip Technology, Inc. of Chandler, Ariz., can be utilized. However, any other integrated circuit microcontrollers can be utilized as well. Regardless of the type of microcontroller utilized, the microcontroller 104 should have low power requirements (in the range of up to 100 uA/MHz) in other to reduce the amount of power required for the microcontroller 104, thus allowing the energy storage module 112 to be of a lower capacity and, consequently, of a smaller size.

In operation, the microcontroller 104 is configured to operate sensor modules 106 and receive sensor signals therefrom. This is described in greater detail below with respect to FIGS. 2A, 2B, 2C, and 2D. The microcontroller 104 can also be configured to convert or reformat the sensor signals into data to be transmitted by transceiver 104 and antenna 110. The operation of the microcontroller 104 and the transceiver 104 is described in greater detail.

The sensor modules 106 can include one or more sensor elements printed directly on the flexible substrate 102. Details of the printing process for these sensor elements are described below in greater detail. Various types of printed sensor elements can be provided for sensor modules 106. Specifically, any type of resistive or capacitive readout sensor elements can be provided. These include, but are not limited to, sensor elements for measurements or detection of temperature, humidity, light, occupancy, gases, and strain/stress. Exemplary configurations for such sensors are illustrated in FIGS. 2A, 2B, 2C, and 2D.

FIG. 2A shows one exemplary configuration for a printed resistive temperature sensor element in accordance with the various embodiments. As shown in FIG. 2A, the resistive temperature sensor element is provided by printing a serpentine resistive path (to minimize the area needed on the flexible substrate 102) using electrical lines for which the change in resistance as a function of temperature is predictable. Thereafter, the resistance of the path is monitored to then determine temperature. In the case of FIG. 1, this can involve the microcontroller 104 applying a constant voltage or current for such a resistive path and monitoring resistance, either directly or indirectly (e.g., based on changes in voltage or current for the resistive path). Thereafter, the microcontroller 104 can determine the temperature based on a known temperature/resistance relationship for the resistive path. For example, the microcontroller 104 can store a lookup table to determine or extrapolate the temperature. Alternative, temperature and resistance may be related via a mathematical relationship or formula, and the microcontroller 104 can be configured to compute resistance based on this relationship or formula.

Although FIG. 2A shows a serpentine or meandering path, the various embodiments are not limited in this regard. Rather, any other design can be utilized in the various embodiments, including spiral, coil, or any other type of path.

Figure 2D:
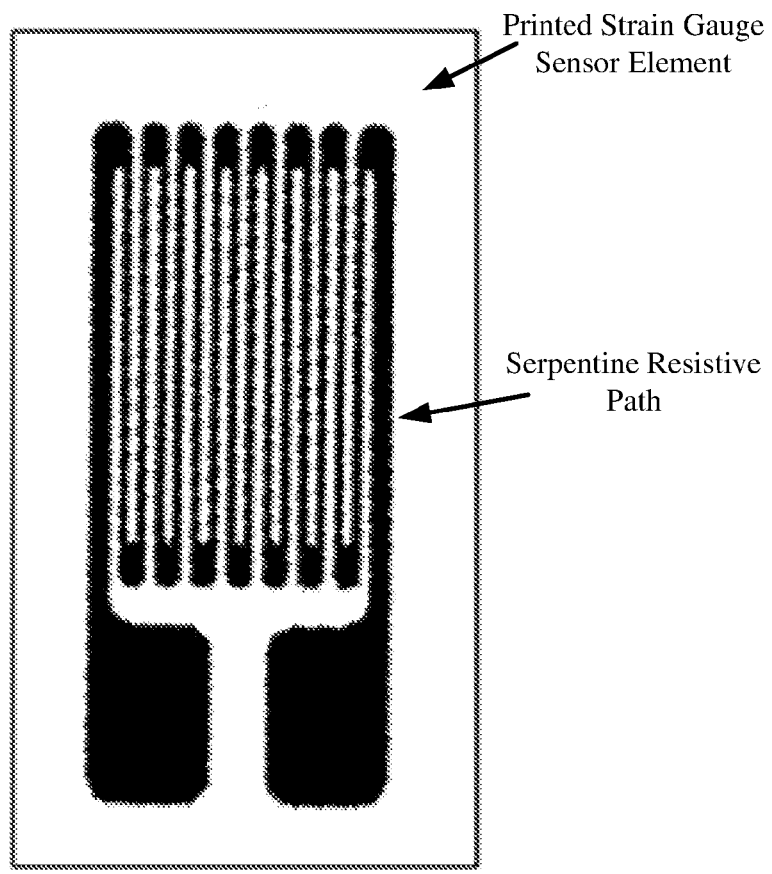
FIG. 2D shows one exemplary configuration for a printed strain gauge sensor element in accordance with the various embodiments.
Figure 2B:
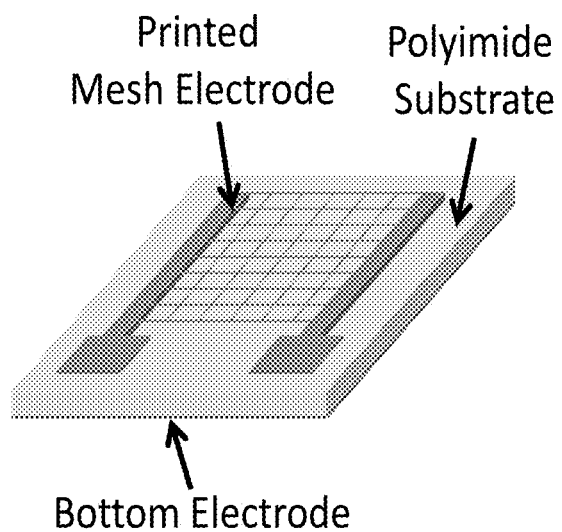
FIGS. 2B and 2C show exemplary configurations for a printed capacitive humidity sensor element in accordance with the various embodiments.

FIG. 2B shows one exemplary configuration for a printed capacitive humidity sensor element in accordance with the various embodiments. As shown in FIG. 2B, this humidity sensor element is provided by printing one or more capacitor elements in a mesh or an array (to minimize the area needed on the flexible substrate 102) using printed dielectric materials for which the change in capacitance as a function of humidity is predictable. Thereafter, the capacitance of the array is monitored to then determine humidity. In the case of FIG. 1, this can involve the microcontroller 104 being configured to perform an oscillator-based or charge-based, or bridge-based measurement of capacitance of the array. In certain embodiments, bridge-based methods are utilized. Thereafter, the microcontroller 104 can determine the humidity based on a known humidity/capacitance relationship for the array. For example, the microcontroller 104 can store a lookup table to determine or extrapolate the humidity. Alternative, capacitance and humidity may be related via a mathematical relationship or formula, and the microcontroller 104 can be configured to compute resistance based on this relationship or formula.

Figure 2C:
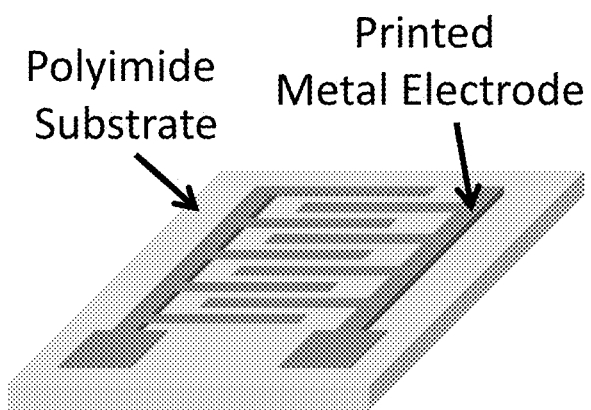

Although FIG. 2B shows one particular configuration for a humidity sensor, the various embodiments are not limited in this regard. Rather, any other design can be utilized in the various embodiments, including a interleaved finger design, as shown in FIG. 2C.

FIG. 2D shows one exemplary configuration for a printed strain gauge sensor element in accordance with the various embodiments. As shown in FIG. 2D, this sensor element is provided by printing a resistive path using electrical lines, where a configuration of the path is selected such that the resistance of the path is sensitive to deformation of the path due to stress and where the changes in resistance as a strain is predictable. For example, as shown in FIG. 2D, a serpentine path can be selected. The printing techniques offer a low-cost solution for the design of strain gauge using metal inks. Additionally, nanomaterials technology is now available for high performance strain gauge development using printing techniques. Thereafter, the resistance of the path is monitored to then determine strain. In the case of FIG. 1, this can involve the microcontroller 104 applying a constant voltage or current for such a resistive path and monitoring resistance, either directly or indirectly (e.g., based on changes in voltage or current for the resistive path). Thereafter, the microcontroller 104 can determine the temperature based on a known strain/resistance relationship for the resistive path. Namely, $G=(\Delta R/R_G)/\in$, where $\Delta R$ is the change in resistance caused by strain, $R_G$ is the resistance of the undeformed gauge, and $\in$ is the strain. In some cases, the microcontroller 104 can store a lookup table based on this relationship to determine or extrapolate the strain. Alternatively, and the microcontroller 104 can be configured to compute resistance based on this relationship.

Although FIG. 2D shows a single serpentine or meandering path, the various embodiments are not limited in this regard. Rather, any other design can be utilized in the various embodiments, including designs with multiple paths and various geometries.

Referring back to FIG. 1, the transceiver 108 can also be an integrated circuit microcontroller. In some embodiments, the microcontroller 104 can be an application specific integrated circuit specifically designed for the particular configuration of the wireless sensor platform 100. However, in other embodiments, a general purpose transceiver integrated circuit chip can also be utilized and programmed for the particular configuration of the wireless sensor platform 100. For example, in one particular embodiment, a MAX1472 low power transmitter, available from Maxim Integrated Products, Inc. of San Jose, Calif., can be utilized. However, any other integrated circuit transceiver circuits can be utilized as well. It should also be noted that while the identified integrated circuit is configured for transmission purposes only, i.e., one-way communications, it is contemplated a transceiver 108 in wireless sensor 101 can be configured to support two-way communications as well. Regardless of the type of transceiver utilized, the transceiver 108 should also have low power requirements in order to reduce the amount of power required for the operating the transceiver 108, thus allowing the energy storage module 112 to be of a lower capacity and, consequently, of a smaller size.

In wireless sensor 101, the transceiver 108 is coupled to antenna 110 for supporting one-way or two-way communications. The antenna 110 can include one or more antenna elements printed directly on the flexible substrate 102. Thus, the transceiver 108 and the antenna 110 can be configured for supporting communications over one or more frequencies. Details of the printing process for these antenna elements are described below in greater detail. Various types of printed antenna elements can be provided to form antenna 110. Exemplary configurations for antenna elements for antenna 110 are illustrated in FIGS. 3A, 3B, and 3C.

Figure 3A:
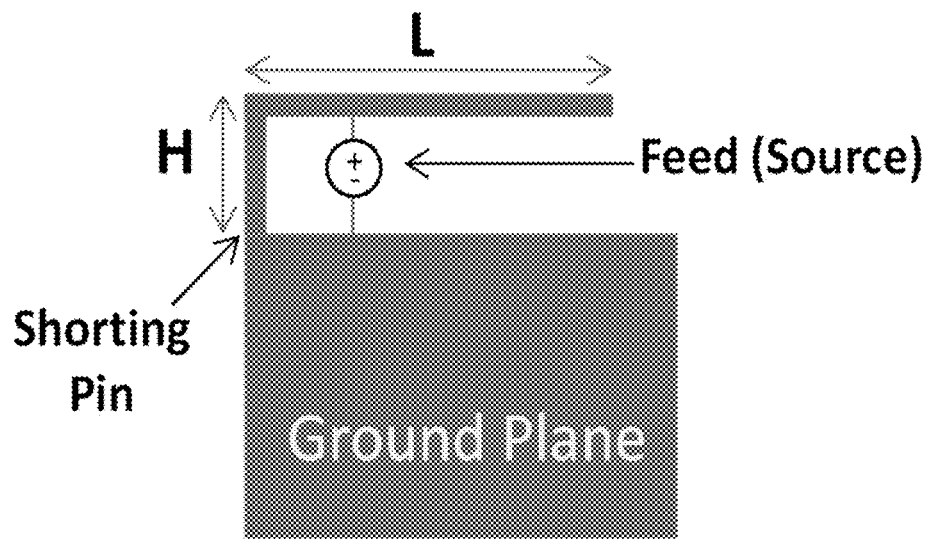
FIGS. 3A, 3B and 3C schematically illustrate configurations for an antenna in a wireless sensor in accordance with the various embodiments.
Figure 3B:
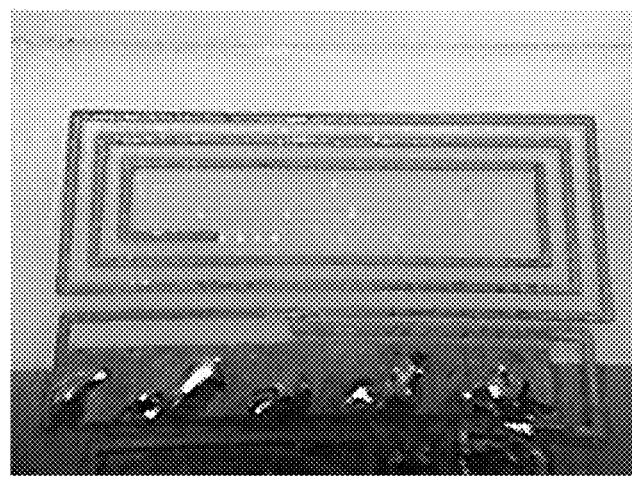

FIGS. 3A and 3B illustrate different views a first printed antenna element according to the various embodiments. In particular, the printed antenna of FIG. 3A is an inverted-F (IFA) antenna capable of supporting communications in the 400-500 MHz range with better than 10 dB return loss over 5 MHz. In this exemplary antenna arrangement, the transmission line 302 can be arranged so as to minimize its area. For example, as shown in FIG. 3B, the transmission line can be arranged in a spiral arrangement to minimize area. Accordingly, such antennas can have areas between 200 and 300 mm².

Figure 3C:
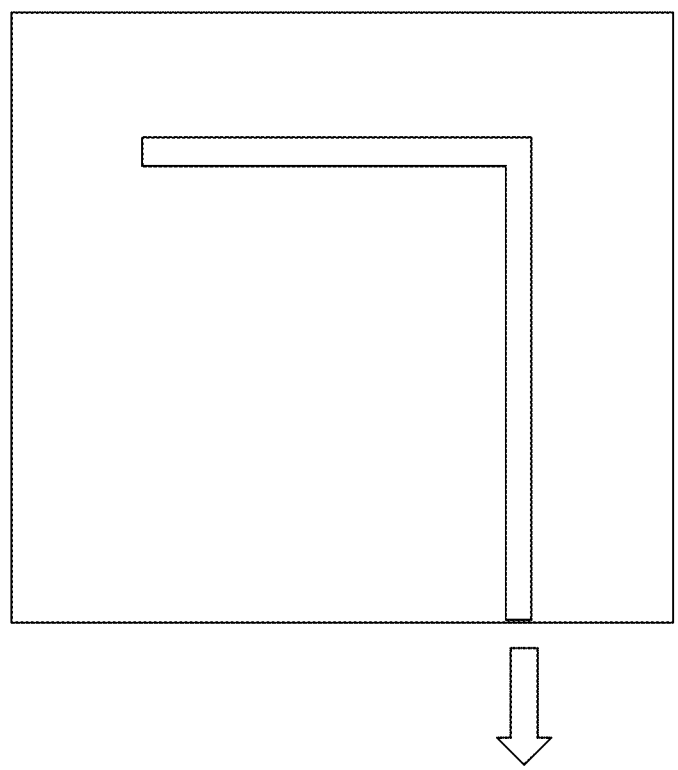

FIG. 3C illustrates a second printed antenna element according to the various embodiments. As shown in FIG. 3C, a monopole antenna design can be utilized to support communications in the 2-3 GHz range with return loss below −10 dB. As with the antenna element in FIGS. 3A and 3B, the monopole antenna element of FIG. 3C can also be configured to minimize area. For example, as shown in FIG. 3C, an L-shaped antenna element can be utilized. L-shaped antennas provide a simple structure, low profile, support high data rates, are easily integrated with transceivers operating in the microwave frequency range, and are easily fabricated.

As noted above, the wireless sensor 101 also includes an energy storage module 112 and, optionally, an energy collection/generation module 114 for recharging the energy storage module 112. The energy storage module 112 can be, for example, a battery (rechargeable or not), a capacitor, a fuel cell, or any other type of energy storage device. In some embodiments, the energy storage module 112 can be provided by one or more discrete components mounted on the flexible substrate 102. In other embodiments, the energy storage module 112 can be printed onto the flexible substrate using 2D or 3D printing techniques. In still other embodiments, a combination of discrete and printed components can be provided.

The energy collection/generation module 114 can be provided in a similar fashion. That is, the energy collection/generation module 114 can be formed from discrete components mounted on the flexible substrate 102, components formed via 2D or 3D printing, or some combination of both. Moreover, the energy collection/generation module 114 can be configured to collect or generate energy in a variety of ways. Additionally, the location of wireless sensor 101 can also dictate the type of the energy collection/generation module 114 used. For example, in areas with sufficient ambient lighting (whether natural or artificial), the energy collection/generation module 114 can be configured as one or more photovoltaic cells. In areas where it is practical to supply a wired power source, the energy collection/generation module 114 can be a wired power source. Alternatively, where it is practical to supply at least one wired power source in the vicinity of multiple wireless sensors, the energy collection/generation module 114 can be an inductive charging system. However, the various embodiments are not limited to any type of power source for the energy collection/generation module 114 and the any other types of power sources or combinations thereof can be utilized in the various embodiments.

Although certain modules and components have been described above, it is contemplated that a wireless sensor in accordance with the various embodiments can be implemented with more or less components than illustrated in FIG. 1. Further, it is also contemplated that additional components may be required for implementing certain components. For example, it can be necessary to provide additional resistive, capacitive, or inductive components for the wireless sensor of FIG. 1 to operate correctly.

Communications System

As noted above, the transceiver 108 and antenna 110 are configured to operate using relatively low power. However, it is also necessary to maximize the range of such a transceiver/antenna combination while maintaining a practical data date. Accordingly, in the various embodiments, the microcontroller 104, the transceiver 108, and the antenna 110 are configured to provide a low power communications system with relatively high data rates.

A first aspect of the communications system of the various embodiments is the utilization of spread spectrum modulation. A transmitter operating using spread spectrum modulation typically has an energy requirement that is significantly lower than that required by a regular Binary Phase Shift Keying (BPSK) transmitter. In some cases, the energy requirement can be 10% of the energy requirement for a conventional BPSK transmitter. Accordingly, a transmitter with as little as 10 milliwatts of output power can have a range of over 0.5 miles by utilizing the spread spectrum modulation. As a result, it is possible to provide operation of a transmitter with such low power consumption as to reduce the power output requirement for an energy generation/collection module to recharge an energy storage module. Thus, by using a spread spectrum modulation, the wireless sensors of the various embodiments can operate with little or no attention or maintenance for the life of the components therein.

Although spread spectrum modulation enables signals to be very weak and allows power requirements to be low, the data throughput for conventional spread spectrum systems is typically lower. Accordingly, this requires longer transmit times which results in energy consumption (power*transmit Time) being no better than BPSK. Accordingly, a second aspect of the communications system of the various embodiments is to encode additional data bits into the transmission by shifting (or time delaying) the spreading code pattern. That is, employing a Code Shift Keying (CSK) for encoding the data.

As a result, the combination of spread spectrum modulation and CSK in the communications system of the various embodiments can provide an improvement in power consumption by a factor of ten. In particular, since the bit coding is more efficient and provides an effective bit rate significantly higher than the actual bit rate, the lower actual bit rate allows a reduction in the required power level of the transmitter without significantly reducing the effective bit rate. Accordingly, a transmitter in a communications system in accordance with the various embodiments can have watt-level performance while actually transmitting only a few milliwatts. This results in a lower power transmitter and lower capacity power sources being required, reducing overall costs and size for the wireless sensor of the various embodiments.

For ease of illustration, one exemplary implementation for a communications system in accordance with the various embodiments is discussed below. It should be noted that the exemplary implementation is but one possible implementation. Thus, the various embodiments are not limited to solely this implementation.

In the exemplary implementation, CSK is implemented using a specific spread spectrum code type, namely Gold codes, and a 10 bit code word length. As noted above, this merely an example, and different lengths of code words and other alternatives to Gold codes can be used in the various embodiments.

Figure 4:
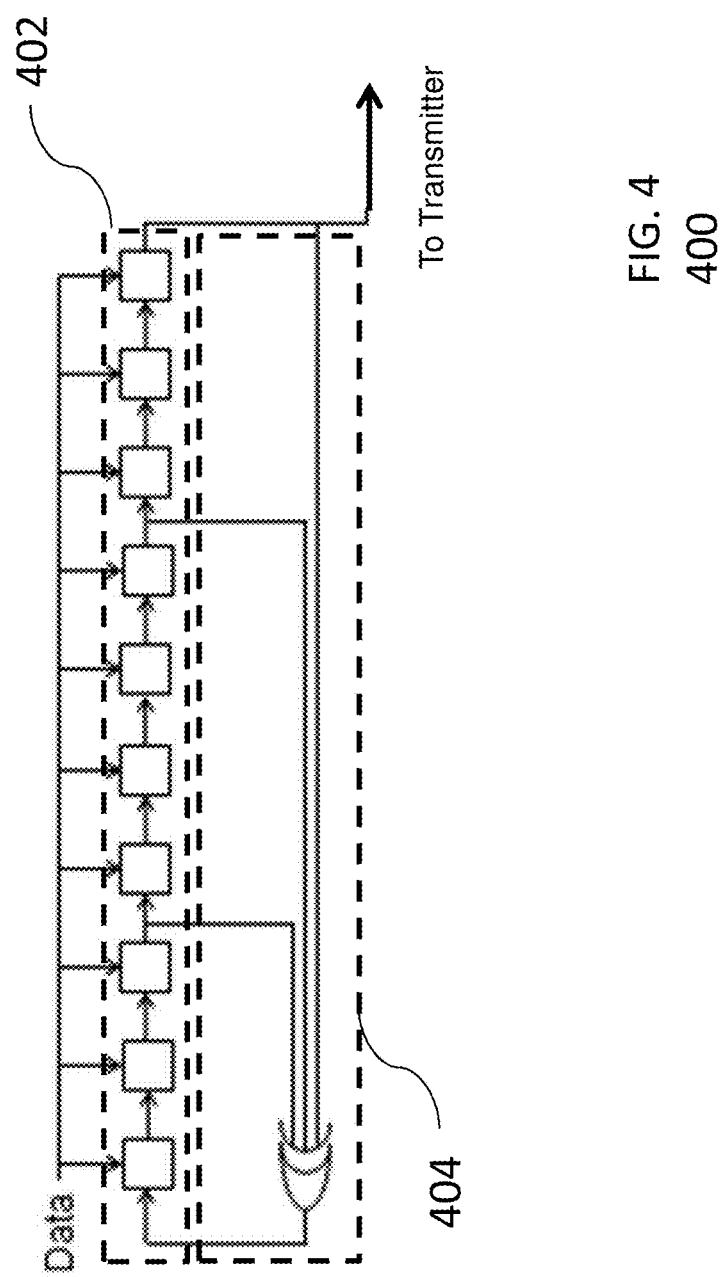
FIG. 4 shows a first exemplary linear feedback shift register for a communications system configured in accordance with the various embodiments.

In the various embodiments, the CSK methodology employs a linear feedback shift register (LFSR) to generate a spread spectrum sequence for a transmitter. This is illustrated in FIG. 4. FIG. 4 shows an exemplary LFSR 400 configured in accordance with the various embodiments. As shown in FIG. 4, the LSFR 400 is formed by a chain of shift registers 402 and a feedback circuit 404. The LFSR 400 is initialized by providing an initial state or seed based on the data to be transmitted. A receiver would then decode the data by figuring out what seed was used to generate the transmitted spread spectrum sequence.

As shown in the exemplary implementation of FIG. 4, 10 shift registers are utilized in chain 402, which allow the seed to encode 10 bits of information (minus 1, since a seed of 0 cannot be used), resulting in a sequence that is 1023 bits long. It should be noted that for a given number of shift register bits, there is a limited number of feedback tap combinations for feedback circuit 404 that will give a code that is maximal length, i.e., words does not repeat itself within the sequence, i.e., a Gold code.

Figure 5:
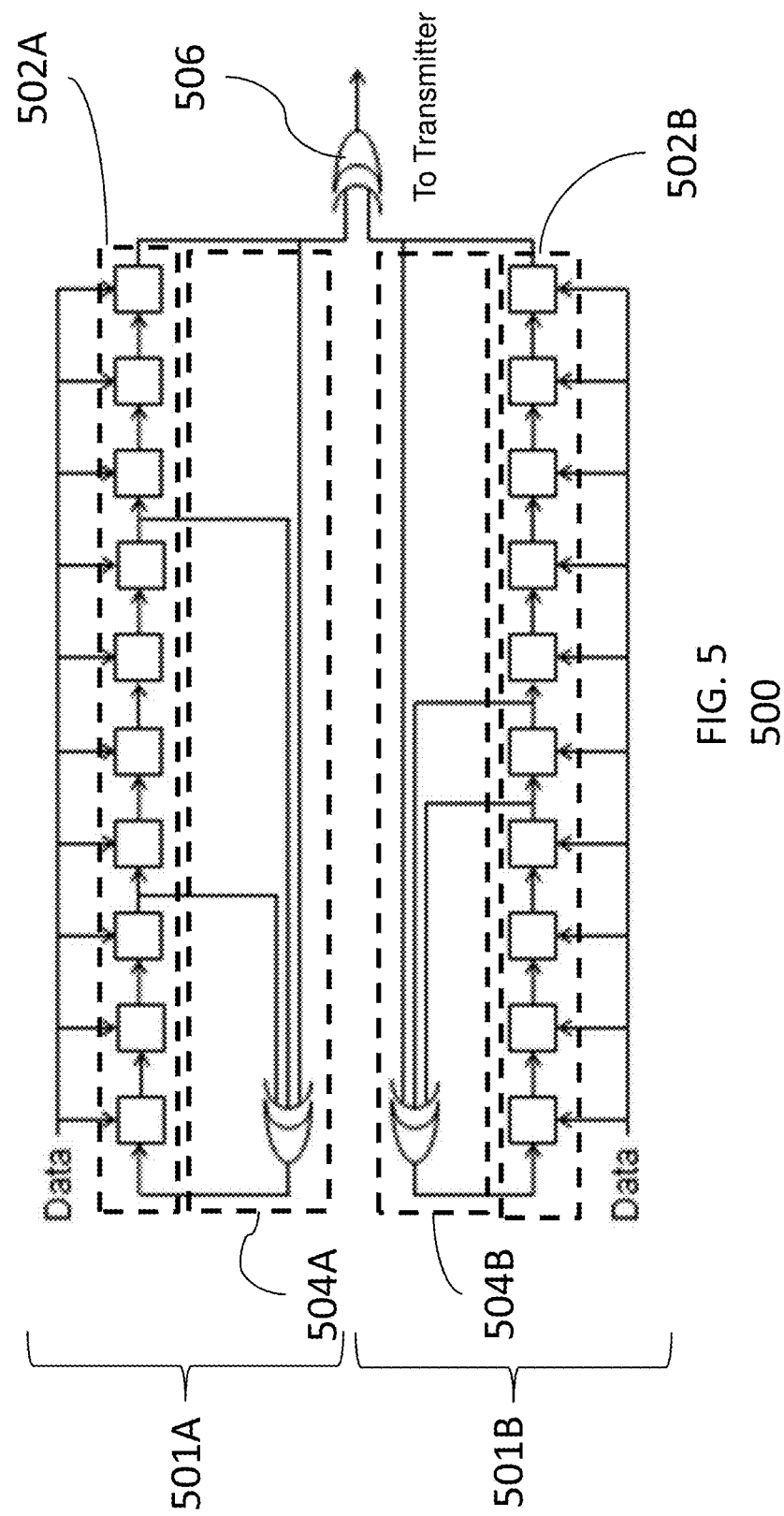
FIG. 5 shows a second exemplary linear feedback shift register for a communications system configured in accordance with the various embodiments.

In some configuration, two LFSRs can be utilized with an exclusive-or gate to increase the number of encoded bits. This configuration is illustrated in FIG. 5A. In this configuration, the LFSR system 500 includes first and second LFSRs 501A, 501B that feed and exclusive OR (XOR) gate 506. Each of the LFSRs 501A, 501B are arranged in substantially a same fashion as LFSR 400 in FIG. 4, with corresponding shift register chains 502A, 502B and corresponding feedback circuits 504A, 504B.

In this configuration, the feedback tap combinations for each of the feedback circuits 504A, 504B are selected for each of the LFSRs 501A, 501B so that a sequence is generated at the output of XOR gate 506 does not repeat itself within the sequence and also has good autocorrelation characteristics. This results in autocorrelation characteristics are still good even if the starting points, i.e., the seed data, is varied. As a result, the two seed values for each of the LFSRs 501A, 501B can be chosen independently from each other, allowing the encoding 20 bits of data in the 1023 bit long sequence.

In the various embodiments configuration, the LFSRs can be implemented using software, hardware, or a combination thereof. In a hardware configuration, a circuit can be provided (as an integrated circuit, discrete components, or printed components) that implements LFSR 400 or LFSR system 500. This circuit can be configured to receive the data (as 10, 20, or any number of bits) from, microcontroller 104, for example, before sending the bit sequence to the transceiver 108.

In a software configuration various routines or code sections can be used to cause microcontroller 104 the various tasks for implementing an LFSR system. Such routines or code sections can include, but are not limited to, routines for:
Shift register calculations;
Conversion of data acquired to one or more seeds;
Specifying feedback taps for producing good Gold codes; and
Generating the sequence for the transmitter based on the foregoing routines.

However, the various embodiments are not limited to any particular number or organization of routines for implementing an LFSR system using software routines or code sections. Rather, an LFSR system for the various embodiments can be implemented in software in any other ways.

In operation, the communication system operates as follows. First, a transmission is provided that consists of an initial blank sequence. This blank sequence is needed as a time reference to show where the start of the data sequence is. The blank sequence does not need to be sequence corresponding to a Gold code, but can be generated using some other code or simply be an agreed-upon sequence. After the initial blank sequence is transmitted, one or more of data sequences can be transmitted.

In the receiving device, the signal from the communications system is then decoded by looking for a pattern that looks like the initial blank sequence. In some embodiments, this can be performed by a brute force method. That is, bit patterns received for the last 1023 bits are compared to an expected bit pattern for the initial blank sequence. When a match is found, it is then known that the subsequent bit patterns correspond to data.

Figure 6:
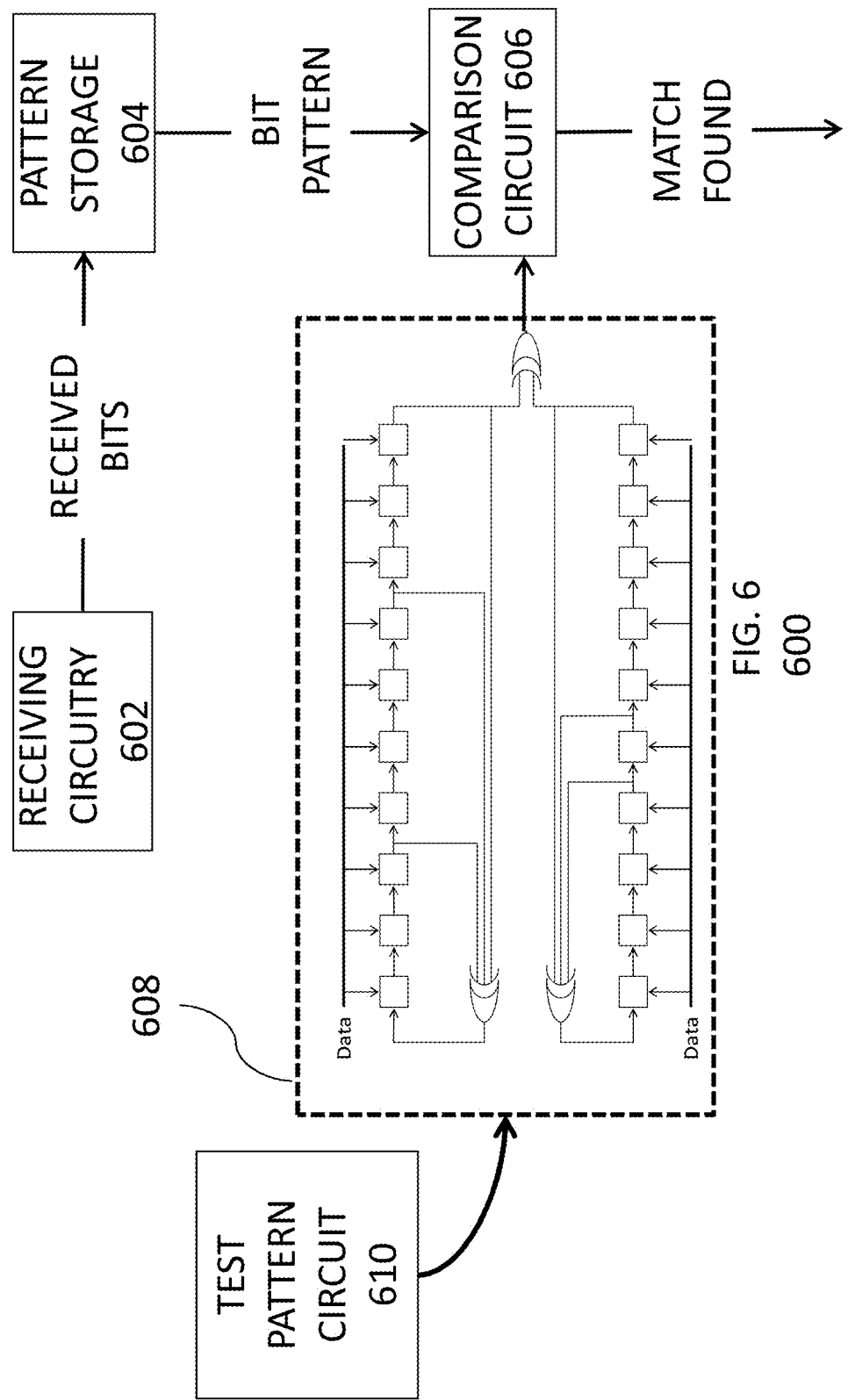
FIG. 6 shows an exemplary circuit at receiver using a brute force method for pattern detection in accordance with the various embodiments.

One exemplary method for decoding the received signal is depicted in FIG. 6. FIG. 6. shows an exemplary configuration for a receiver 600 configured for deciding signals in accordance with the various embodiments. Because of the varying data, there is not one pattern to look for but a whole family of patterns, with each family member pattern being a possible data packet of numbers. Accordingly, one methodology of finding which family member packet was sent is to do an exhaustive search. For 20 bits of data, this means there are roughly one million possibilities for the seed values and thus a comparison is required for the million test case patterns against the pattern that was received. Although this sounds computationally intensive, a desktop or laptop computer can be programmed to perform this search in under 15 seconds. Using dedicated circuitry, such as an ASIC or a field programmable gate array (FPGA) device, this search can be performed in 10 milliseconds or less. Although such times may appear to be relatively large, they are sufficient for many types of applications. For example, in an HVAC application, a sensor reading may only need to be updated once a minute. Thus, in such conditions, these performance results are acceptable. In other conditions, high performance dedicated circuitry can be provided to improve computation speed.

When comparing patterns, the patterns only need to match relatively well, i.e., not perfectly. Thus, the blank sequence at the beginning has to match a certain threshold, such as 80% of the bits need to match. In the case of the data pattern, there is no absolute threshold. Instead, it is determined on which family member has the best match compared to the other family members.

As with the transmitter, the decoding process can be performed in software. This process can involve receiving and storing patterns and looking for the blank pattern. This can involve loading up the comparing array, i.e., the array for the blank sequence, comparing the accumulated pattern as packets come in. Thereafter, a determination of whether the comparison threshold has been met can be made. If the threshold is not yet met, the process is repeated as additional packets are received. Once the threshold is met, the process stops and the system is prepared for decoding the data sequence.

Referring back to FIG. 6, the process for detecting the initial blank pattern is performed as follows. First, receiving circuitry 602 in receiver 600 can receive signals transmitted from a sensor using an LFSR method, as described above with respect to FIG. 4 or FIG. 5. This causes a sequence of bits, corresponding to the sequence of bits provided to the transmitter in FIG. 4 or FIG. 5, to be forwarded to pattern storage 604 to store the pattern produced by the number of bits of interest. For example, when a next bit is received, a new 1023 bit pattern is stored at pattern storage 604. This new bit pattern is then is forwarded to comparison circuit 506 to determine whether the bit pattern corresponds to the expected bit pattern for the initial blank sequence.

As noted above, to determine whether the bit pattern corresponds to the expected bit pattern, a brute force method can be used. This involves providing an LFSR circuit 608 to generate test bit patterns for the comparison at comparison circuit 606. In particular embodiments, this is accomplished by providing a test pattern circuit 610 to control the LFSR circuit 608. The test pattern circuit 610 can generate data inputs for the various possibilities of a bit pattern including the initial blank sequence and cause the LFSR circuit to produce the sequence of bits for each of the test bit patterns corresponding to these seed values. At comparison circuit 606, the received bit pattern can then be compared to each of the test bit patterns. If no match is found, the process is repeated for the next bit pattern stored at pattern storage 604. Once a match is found, the comparison circuit 606 can output a signal that a match has been found, indicating to the receiver 600 that subsequent bits are associated with data.

For the decoding of the data itself, packets for 1023 bits can be similarly accumulated and compared to the families of patterns. In this case, the family of patterns with a highest degree of match are then used to decode the data. Thereafter, the data can be separated, if necessary, into the one or more measurements represented by the signals. These processes can be repeated for each of the wireless sensors providing data.

In one exemplary embodiment, FGPA logic can be configured to provide what is commonly called a correlator. A correlator is used to detect whether the received data stream contains the expected bit pattern. This circuit is used to detect the preamble and is used again to detect a matching data pattern when performing the exhaustive search on the possible transmitted data streams. Although the circuit's function can be implemented on a regular computer in software, it can be implemented on an FPGA for higher speed.

Figure 7:
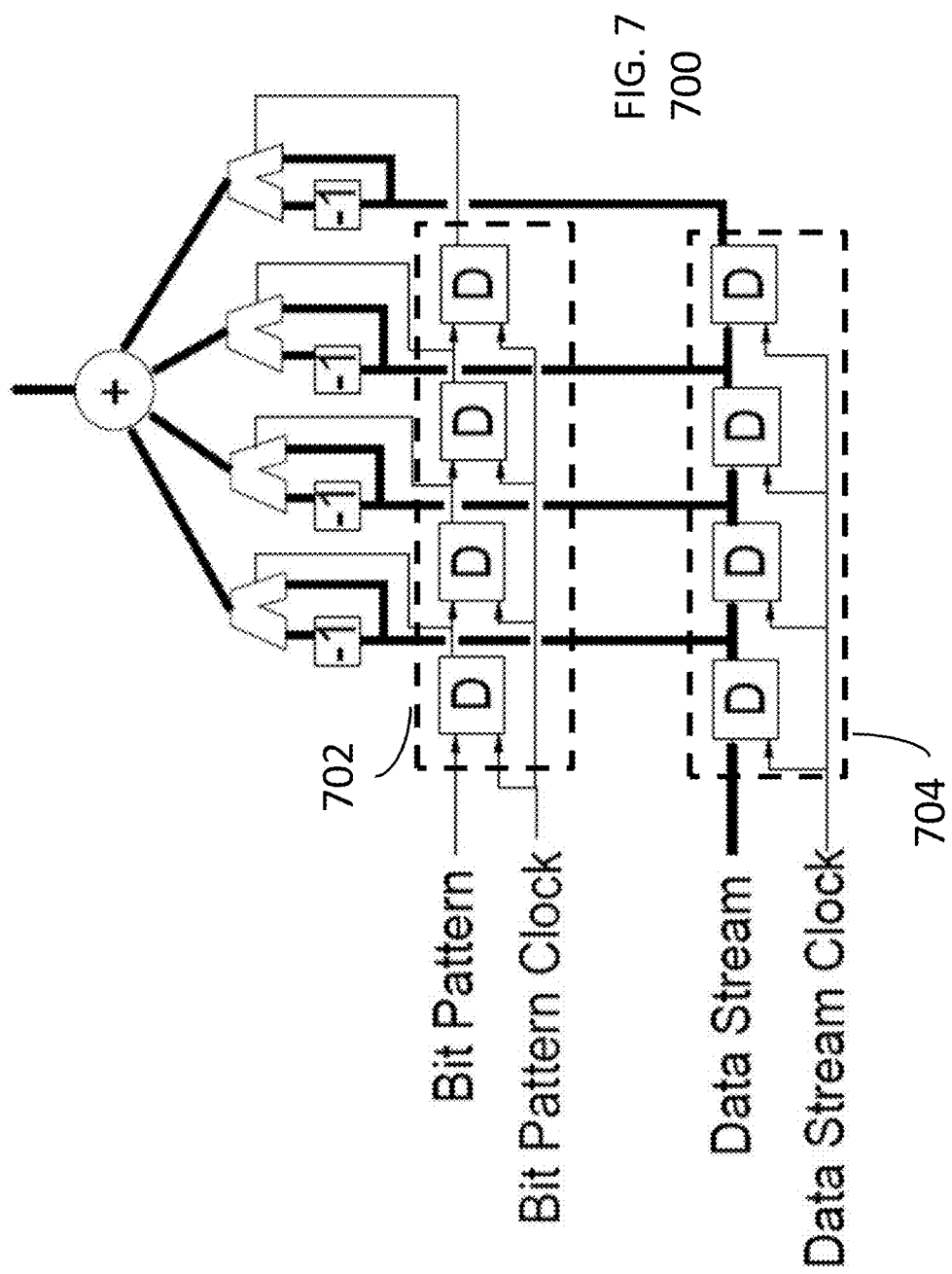
FIG. 7 shows an exemplary circuit at receiver using a correlator circuit method for pattern detection in accordance with the various embodiments.

A simplified version of a correlator circuit 700 for use in the various embodiments is shown in FIG. 7. For ease of illustration, FIG. 7 is limited to a pattern of length 4. However, in the various embodiments, the correlator can be of any length, such as 1023, for example.

As shown in in FIG. 7, two groups of 'D' blocks 702, 704, which are flip-flops, are used to store the pattern bits or data bits. The Bit Pattern input for block 702 is where the pattern that is to be detected is loaded. The Data Stream input for block 704 is where the digitized baseband received signal that is clocked at the spread spectrum clock rate. The signal is usually digitized at 8 bits of resolution.

The circuit 700 works by adding or subtracting the data stream points depending on whether the corresponding bit pattern is a 1 or 0. If the bit pattern and the data stream containing a waveform of the same bit pattern line up, the circuit 700 will add the corresponding data stream point when the point is positive and subtract it when the point is negative, which will result in a large value from the circuit output when the match occurs. If the patterns do not match, the adds and subtracts will result in random values which will sum to a small value.

When the receiver is looking for the preamble, the preamble pattern is loaded into the Bit Pattern input of block 702 and this pattern remains there during the preamble search. Received baseband signals are then entered in the Data Stream input of block 704. When a large output occurs, it is concluded that a desired signal is coming in, and so the Data Stream input receives another 1023 samples that corresponds to the data portion of the transmitted signal. Once the 1023 samples have come in, the Data Stream Clock stops so the sampled data stream stays in the circuit. Then the test pattern identified from FIG. 6 is loaded into the Bit Pattern input of block 702. For each value of test data fed into the test pattern circuit of FIG. 6, the corresponding output from the correlator is measured. The test data that corresponds to the strongest output of the correlator is then declared to be the data that was transmitted.

The correlator logic can be used to measure how well a search possibility matches the actual received data. In operation, correlator logic can make the measurement needed for all possibilities in a single period (10 nanoseconds) of the FPGA clock signal, thus for all 1 million possibilities the search time is 10 ms.

Fabrication

As noted above, one aspect of the various embodiments is to provide at least some of the components in wireless sensors 101 using 2D or 3D printing techniques. Accordingly, with respect to FIG. 8, an exemplary method 800 for fabricating a wireless sensor in accordance with the various embodiments is illustrated.

Method 800 begins at step 802 and continues to step 804. At step 804, a flexible substrate is selected and provided. As noted above, the flexible substrate can be made from paper, fabric, glass, or plastic materials. The selection of the flexible substrate can be based on a variety of factors. For example, the material for the flexible substrate can depend on the intended application. That is, in some cases it may be necessary that the material be chemically or biologically compatible with the environment it is to be deployed in. Accordingly, certain materials may be required for certain applications. Alternatively, the type of material can be selected based on the manufacturing process required. That is, if certain processing is required for some of the components for the wireless sensor, then the materials for the flexible processing need to be compatible. For example, different materials may have different stable temperature ranges: apolyimide substrate is suitable for device integration at processing temperatures up to 400° C. Low-cost, transparent substrates such as Polyethylene Naphthalate and Polyethylene Terephthalate are suitable for processing temperatures below 200° C. Powercoat® paper facilitates electronic component integration up to a processing temperature of 200° C. Accordingly, if processing in a particular temperature range is required, then a compatible material needs to be selected.

In the various embodiments, the dielectric, metal, and semiconductor material selection depends on the printing characteristics for a selected flexible substrate and the achievable performance and reliability for the target application. The printing characteristics and quality of the printed features will depend on the ink formulation, substrate morphology, and process temperature. Thus, the ink technology used for a selected flexible substrate is limited solely by the desired line resolution, cost considerations, and any requirements for curing in order to limit substrate thermal damage. Such requirements can be met by using photonic pulse thermal processing techniques to allow processing of high quality materials on low temperature substrates. The selection of the flexible substrate can also be influenced by the availability of various techniques (surface oxidation, hydrogenation, nitridation, etc.) that can influence the surface energy of the flexible substrates for enhanced ink adhesion and improved print reliability are also being developed to further minimize the influence of substrate material on the achievable print quality and integration complexity.

Further, the material for the flexible substrate can be provided as individual substrates, multiple substrates on a sheet, or multiple substrates on a roll. For example, as discussed above, polyimide films can be provided as the flexible substrates. In some configurations, the flexible substrates can be pre-processed to include an adhesive backside, bolt openings, or any other type of feature to allow the flexible substrate to be mounted on a surface. These are provided by way of example and not by way of limitation.

Accordingly, the substrates can be configured in any other way in the various embodiments.

Once the substrates are provided at step 804, the method can proceed to forming of components and wiring for the wireless sensors. In particular, this can involve selecting a design for the wireless sensor (step 804), introducing, via the printer, one or more inks onto the flexible substrate (step 808), curing the one or more inks (step 810), and repeating as needed to form additional components.

With respect to the selection of a design at step 806, this can involve providing, in the form of one or more computer-aided drafting (CAD) files, instructions for a 2D/3D printer. In the various embodiments, these CAD files can represent one or more layers to be printed for the one or more sensor elements to be included. For example, in the case of the temperature, humidity, and strain gauge sensor elements discussed above, the CAD files can define one layer representing the printing pattern for dielectric materials to be formed for the humidity sensor and a second layer representing the printing pattern for the resistive materials for forming the conductive portions of the sensors elements. Optionally, this second layer can also define the wiring to providing interconnects between the various components in the wireless sensor. The CAD file can be used for the design of a multilayer device such as transistor. The CAD file can include alignment marks so that the various features can be aligned to form a complete device. For example, the various CAD files can be used to print and align source, drain, and gate layers to form a functional transistor.

In some embodiments, the wireless sensor can require multiple levels of resistive, capacitive, or inductive materials. For example, it may be desirable to utilize different types of resistive layers for temperature and strain gauge sensor elements to avoid temperature significantly affecting strain measurements and vice versa. Accordingly, in such cases, the CAD files can define layers corresponding to each of these different layers.

Following the selection of a design at step 806, the appropriate ink can be deposited at step 808. The ink can partially or completely form a device on flexible substrate of interest. A wide spectrum of inks is available for the printing of dielectric, semiconductor, and metal layers for discrete and integrated component and device development. The deposition process based on printing inks typically involves the deposition of ink droplets to form the pattern required. The print resolution depends on the control of drop volume and drop overlap to define the target pattern. The current printers exploiting inks for flexible electronic applications can control drop volumes of 1 picoliter and print feature sizes as small as 5 µm. In some configurations, this can be performed via inkjet or aerosol jet processes. A schematic of an exemplary inkjet process utilized in the various embodiments is described with respect to FIGS. 9A and 9B.

Figure 9A:
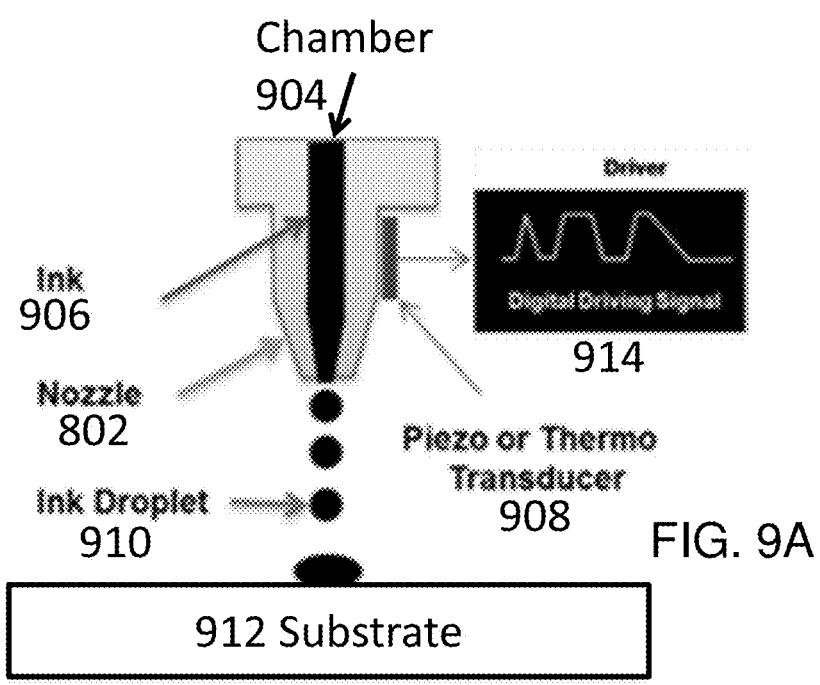
FIG. 9A shows a schematic illustration of an exemplary inkjet device in accordance with the various embodiments.

FIG. 9A shows a schematic illustration of an exemplary inkjet device in accordance with the various embodiments. As shown in FIG. 98A, the inkjet device includes a nozzle 902, with an inner chamber 904 for holding ink 906, and a transducer 808 to cause the nozzle 902 to output ink droplets 910 onto a substrate 912. In particular, when the transducer 908 is activated, the transducer 908 can be configured to apply pressure to at least one portion of the inner chamber 904 to "squeeze out" the ink droplets 910. The current print technology can control drop volumes down to 1 picoliter. Various ink-based printing systems can control feature sizes down to 5 µm. The target feature size ultimately defines the suitability of inks and printing systems for flexible electronic applications. In the various embodiments any types of nozzle designs can be utilized. Further, any types of transducers can be utilized as well, such as piezoelectric or thermoelectric, to name a few. Moreover, any ink printing method is suitable for the various embodiments that can provide line width control in a desired range. In particular embodiments, the range can be 1-500 µm. A printed feature size control in the range of 1-200 µm is suitable for the integration of resistor, capacitor, inductor, transistor, diode, solar cell, and thin film battery components on the wireless sensor platform described in FIG. 1.

Figure 9B:
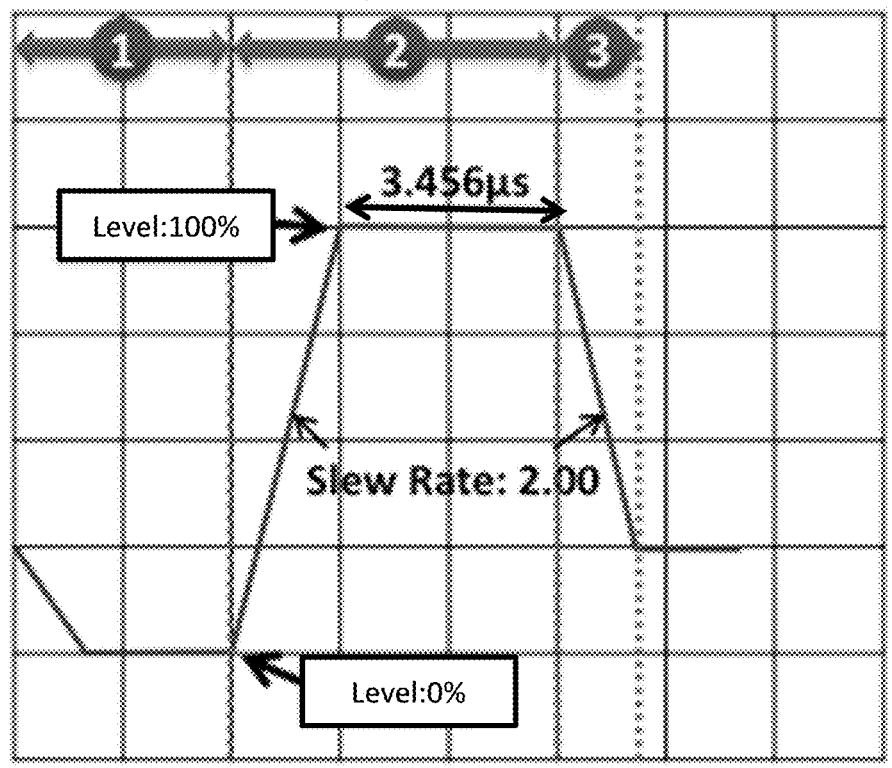
FIG. 9B shows a configuration for a driving pulse for the inkjet device of FIG. 7 in accordance with the various embodiments.

As shown in FIG. 9A, the transducer 908 is operated by providing a driving signal 914. The driving signal 914 can consist of a number of pulses for causing the ink droplets 910 to be produced. FIG. 9B shows a configuration for one of these pulses. As shown in FIG. 9B, the process consists of 3 phases. In phase 1, essentially no signal is provided to allow the inner chamber 804 to be filled to capacity. In phase 2, the droplets are created. The signal at phase 2, includes the rise time and the peak value maintained for the pulse, corresponding to the portions of the waveform causing pressure to applied or maintained by the transducer 908, causing ejection of the ink droplets 910 from the nozzle 902. Thereafter, at phase 3, the pressure provided by the transducer 908 is reduced to allow the inner chamber 904 to recover to refill the inner chamber 904 with ink. This portion corresponds to the fall time portion of the pulse. Thus, in operation, a slew rate is provided for each for the rise time and fall time, and a hold time is provided for phase 2.

In the various embodiments, the configuration of the pulse vary based on a variety of factors, including target feature width, type of ink, nozzle and inner chamber geometry, and transducer type and response, target electrical parameters (R=1-1000 ohms, C=1-1000 pF, RLC circuit frequency response range=1 MHz to >10 GHz), to name a few. In particular embodiments, the metal, dielectric, polymer, and nanomaterial patterns can be printed down to a line-width of 50 µm by using a drop spacing of 15 µm and a drop volume in the range of 1-10 picoliters. Some of the inks available for such printing include inks including, for example, Silver, Copper, Carbon, Gold, Carbon Nano Tubes, Graphene, and conductive polymers (e.g., PEDOT materials from Sigma-Aldrich Co. LLC of St. Louis, Mo.). The print definition or quality will strongly depend on the ink characteristics, substrate surface energy and roughness, and printer capabilities. For example, utilizing a DIMATIX materials printer, available from Fujifilm Dimatix Inc. of Santa Clara, Calif., it is possible to generate 1 µL and 10 µL drops to control line features down to about 20 µm. A drop velocity in the range of 6-11 m/s works for most of the substrates. The printer can handle ink viscosity in the range of 2-30 CPS while a viscosity of 10 centipoise is ideal.

As noted above, following the deposition of ink at step 808, a curing step can be performed at step 810. In the various embodiments, this curing step can be performed in a variety of ways.

A first aspect of the curing process is when it is performed. In some configurations curing can be performed immediately following the deposition of a particular ink type. In other configurations, several types of inks can be deposited first and then simultaneously cured thereafter. In some configurations, the time at which curing is performed may be based on the structure to be formed. For example, in the case of the humidity sensor discussed above, dielectric layers and resistive layers are needed to form the capacitor for the humidity sensor. Accordingly each layer may require a deposition and curing step immediately thereafter to allow another layer to be formed thereon. In another example, if a minimum feature size is required, a curing can be immediately performed after deposition of ink to ensure that subsequent handling of the substrate does not affect such features significantly.

A second aspect of the curing process is the process used. In the various embodiments, any type of curing process compatible with the substrate type can be used. In the case of plastic substrates, a low thermal budget process would be needed in order to avoid thermal damage to the plastic substrate. Depending on the substrate, the hot-plate or oven curing can be used to cure the printed pattern. A high temperature curing is critical for many materials to achieve the desired material and device characteristics. For example, in some embodiments, pulse thermal processing (PTP) can be used. PTP is generally carried out by using lamps, lasers, or other sources of photonic energy that can be controlled over relatively short time scales. Thus, PTP can provide thermal processing sufficient to cure printable ink, but over a relatively short time scale (microseconds to milliseconds). As a result, inks can be cured without significant damage to underlying substrates that are susceptible to thermal data, such as plastic substrates. A further advantage of PTP processes is they can be adapted for use with roll-to-roll processing, as they can be adapted to treat an area as large or as small as desirable. In the various embodiments, PTP process parameters are: Peak PTP power density as high as 20 kW/cm$^2$ and pulse width in the range of 20 microseconds-20 milliseconds. For most of the printed patterns on flexible substrates, a power density in the range of 0.5-10 kW/cm$^2$ is sufficient. A PTP pulse width in the range of 250 μs-5 ms is suitable. The number of photonic curing pulses can be in the range of 1-200. The PTP technique can be exploited for both thermal and UV-processed material sets due to the broad-spectrum output in the range of 200-1500 nm. However, the various embodiments are not limited to PTP curing processes. Rather, in the various embodiments any other suitable curing methods can also be used in place of or in combination with PTP curing processes.

Once the printing and curing has been performed at steps 808 and 810, discrete components can be placed or mounted on the substrate at step 812. Thereafter, if needed, additional printing and curing can be performed at step 814. For example, the discrete components mounted on the substrate can be electrically connected to the printed components via printed lines in some embodiments. In another example, the electrical characteristics of the printed components may be evaluated and, in the case there the electrical characteristics fail to meet target values, additional printing can be used in some instances to "correct" such features. Thus, in the case where resistance of an electrical line is too high, the line thickness or width can be increased to provide the desired resistance. A metal line thickness in the range of 1-100 μm is suitable for a variety of electronic applications. Similarly, in the case where capacitance is too low, the capacitor area can be increased via printing of additional capacitor areas. In still another example, additional printing can be used after the wireless sensor is completed to correct damage. For example, if an electrical line is scratched, additional printing can be provided to repair the damage. Once such additional printing is performed, the method can end at step 616.

Figure 8:
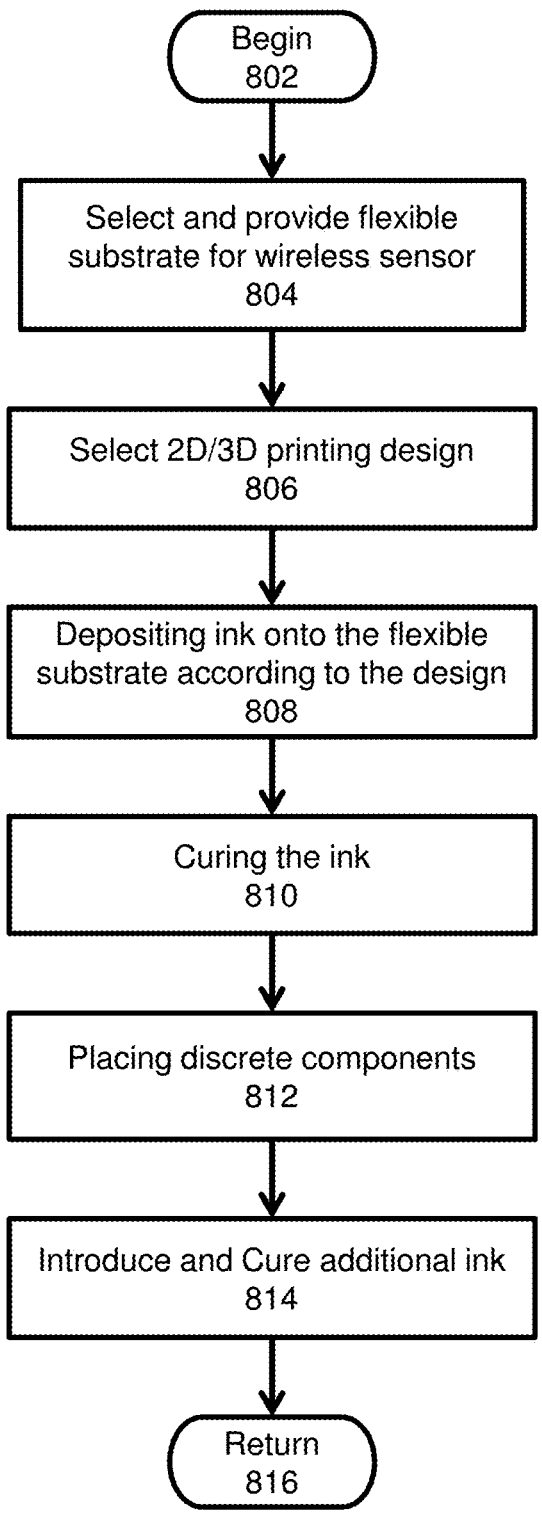
FIG. 8 shows an exemplary method for fabricating a wireless sensor in accordance with the various embodiments.

Although the process flow of FIG. 8 has been described with steps performed in a certain order, this is solely for explanatory purposes. In the various embodiments, the steps of method 700 can be performed in different orders and different combination. For example, as noted above, the printing and curing processes can be performed in a variety of ways. In some cases, printing and curing can be performed on a per material basis. In other cases, the printing and curing can be performed on a per component basis. In other cases, the printing and curing can be performed in various stages intermixed with steps of the placement of discrete components.

EXAMPLES

The following examples and results are presented solely for illustrating the various embodiments and are not intended to limit the various embodiments in any way.

To evaluate the feasibility of a wireless sensor in accordance with the various embodiments, several aspects of the fabrication process were evaluated to determine if desirable electrical characteristics were achievable. In particular, an evaluation was made to determine that electrical lines could be printed with line widths under 100 μm and whether such lines were useful for producing printed sensors and antennas. Specifically, printed sensors including temperature, humidity, and strain gauge sensors.

To evaluate line width control, a pulse waveform was developed. Silver metal lines were printed on polyimide (PI) substrates by inkjet printing using SUNTRONIC Silver (Ag) ink (20% Ag nanoparticles in ethanediol/ethanol) from Sun Chemical Corp. of Parsippany, N.J. The peak particle size was about 150 nm. The Ag ink viscosity (10-13 cP) and surface tension (28-31 dynes/cm) were suitable for printing by an inkjet printer, specifically a DIMATIX DMP-2381 printer. The DMP-2831 printer allows the deposition of fluidic materials on flexible substrates, utilizing a disposable piezo inkjet cartridge. This printer can create and define patterns over an area of about 200×300 mm and handle substrates up to 25 mm thick with an adjustable Z height. For Ag metal line printing, the temperature of the vacuum platen, which secures the substrate in place, was maintained at 50° C. The Ag patterns were printed using 1.5 mL cartridges with typical drop sizes of 10 picoliters. The Ag ink was filtered through 0.45 μm syringe filter prior to loading into the cartridge. The shape, velocity, and volume of expelled drops were controlled by optimizing the voltage pulse applied to the piezoelectric nozzles. For printed metal lines, the cartridge print height, drop spacing, and drop velocity were maintained at 1.0 mm, 20 μm, and 7 m/s, respectively. Based on these waveforms, line width control below 100 μm was easily achieved. Based on the pulses described above, the performance of temperature, humidity, and strain gauge sensors was evaluated. This is discussed below with respect to FIGS. 10A, 10B, 11A, 11B, 12A, and 12B.

Figure 10A:
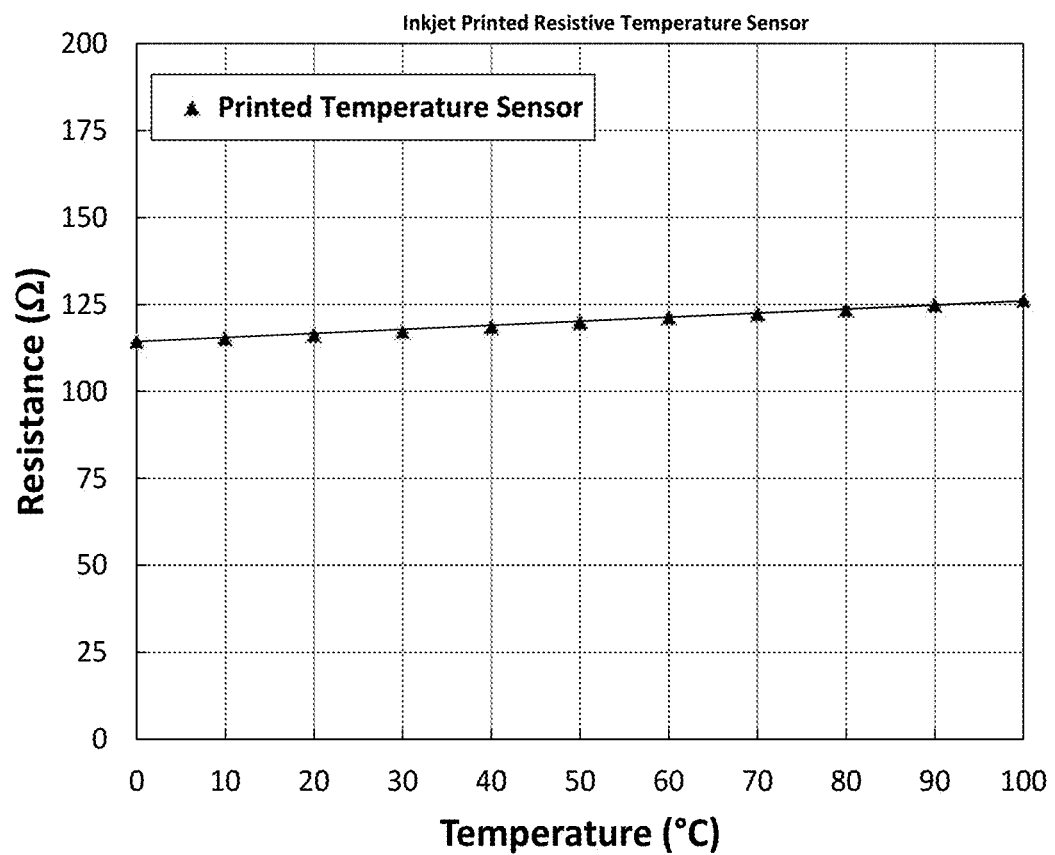
FIG. 10A shows an x-y plot of resistance as a function of temperature of a printed resistive temperature sensor in accordance with the various embodiments.
Figure 10B:
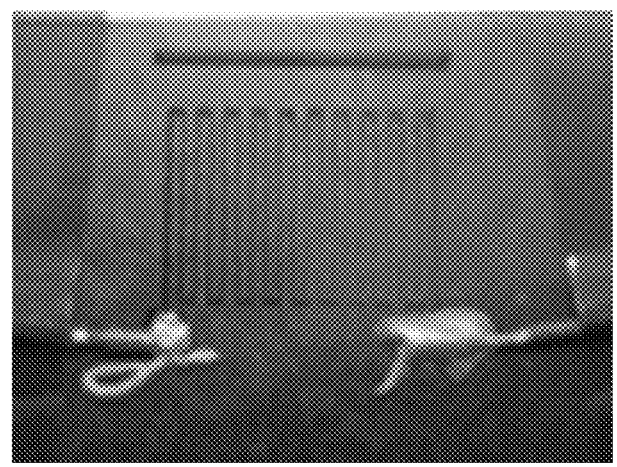
FIG. 10B shows a photograph of a printed resistive temperature sensor in accordance with the various embodiments.

FIG. 10A shows an x-y plot of resistance as a function of temperature of a printed resistive temperature sensor in accordance with the various embodiments. The printed resistive temperature sensor, was printed on a PI substrate in a serpentine pattern, similar to that illustrated in FIG. 2A, and printed using the waveform described above. FIG. 10B shows a photograph of the resulting sensor. The resistive temperature sensors were printed on PI substrates at a Ag drop-spacing of 15 μm and the metal line-width and spacing were maintained at 200 μm and 1000 μm, respectively.

As shown in FIG. 10A, relationship between temperature and resistance in the printed resistive temperature sensor was substantially linear. In particular, this sensor provided a sensitivity of $1.02 \times 10^{-3}$ Ohm/° C. Accordingly, the sensitivity and linear relationship illustrates how the printing process described above is suitable for producing printed resistive temperature sensors in accordance with the various embodiments.

Figure 11A:
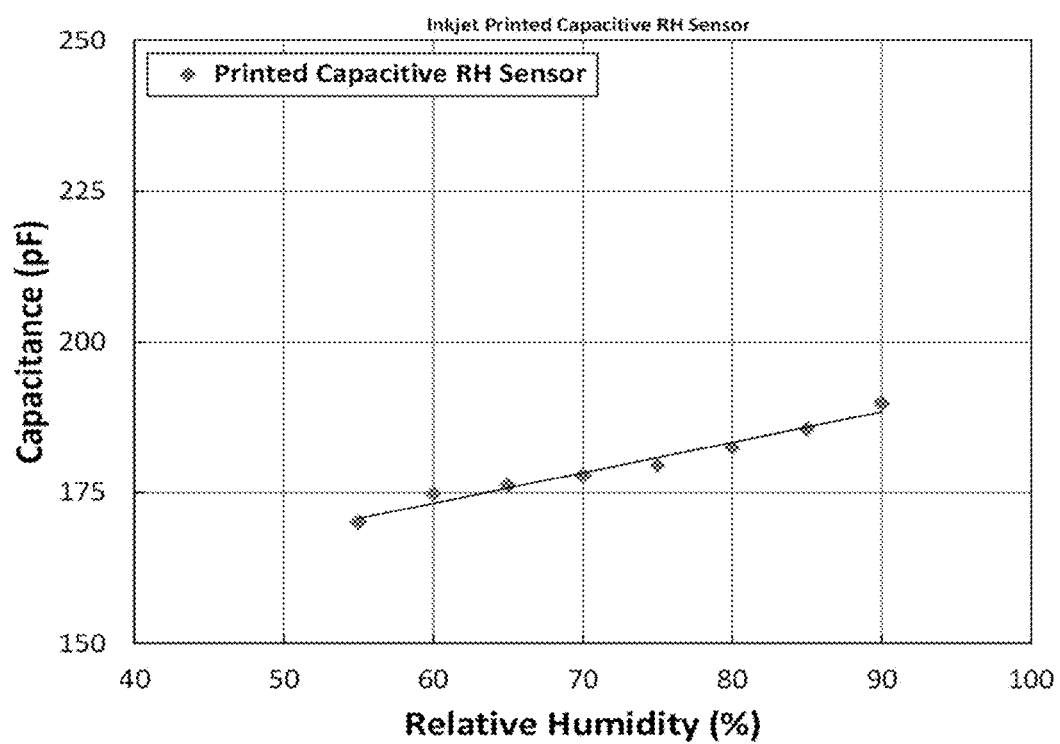
FIG. 11A shows an x-y plot of capacitance as a function of relative humidity of a printed capacitive humidity sensor in accordance with the various embodiments.
Figure 11B:
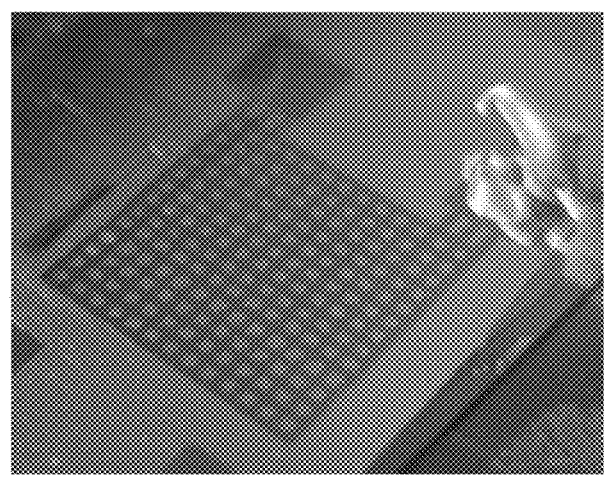
FIG. 11B shows a photograph of a printed capacitive humidity sensor in accordance with the various embodiments.

FIG. 11A shows an x-y plot of capacitance as a function of relative humidity of a printed capacitive humidity sensor in accordance with the various embodiments. The printed capacitive humidity sensor was printed on polyimide in pattern similar to that illustrated in FIG. 2B, and printed using the waveform described above. FIG. 11B shows a photograph of the resulting sensor. The metal line width was close to 200 μm. The meshed-electrode pattern had about 31% open area for humidity penetration.

As shown in FIG. 11A, relationship between relative humidity and capacitance in the printed capacitive humidity sensor was substantially linear. In particular, this sensor provided a sensitivity of 0.50 pF/% RH, matching the performance of commercially available sensors. Accordingly, the sensitivity and linear relationship illustrates how the printing process described above is suitable for producing printed capacitive humidity sensors in accordance with the various embodiments.

Figure 12A:
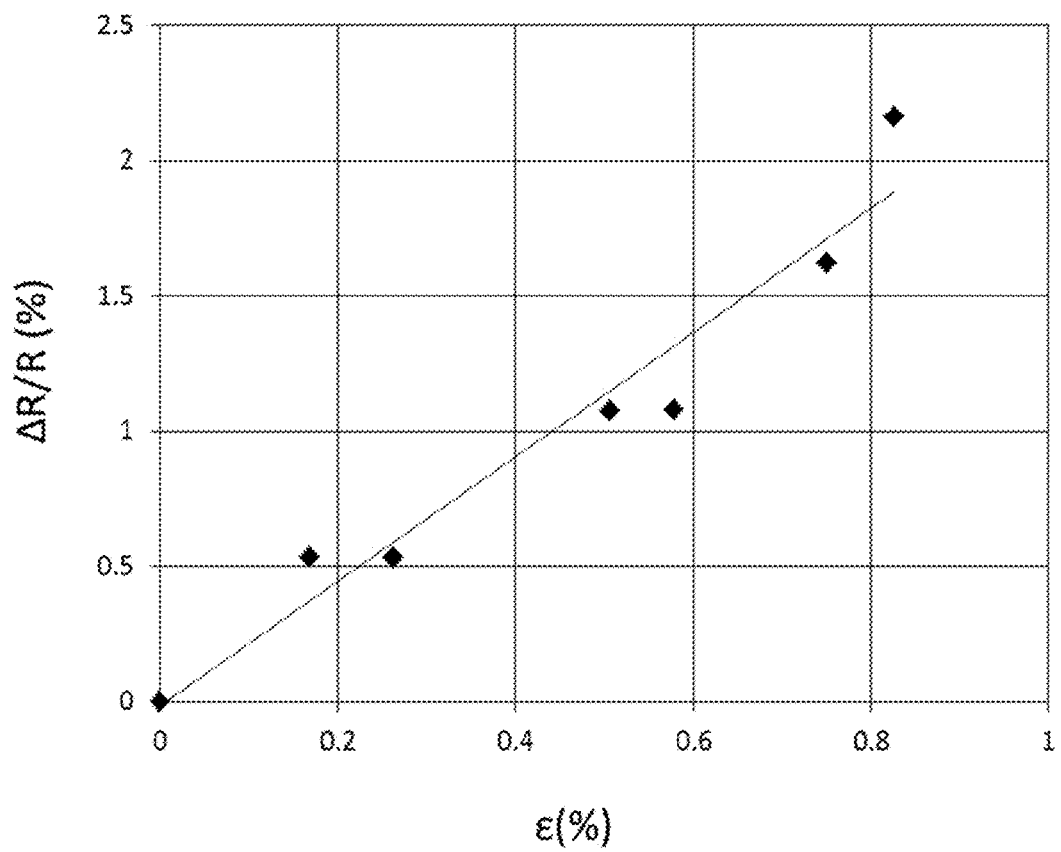
FIG. 12A shows an x-y plot of the change in resistance as a function of strain.
Figure 12B:
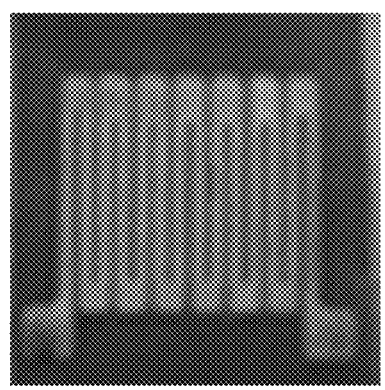
FIG. 12B shows a photograph of a printed strain gauge sensor in accordance with the various embodiments.

FIG. 12A shows an x-y plot of the change in resistance as a function of strain. The mechanical characteristics of a printed strain gauge integrated on PI substrate and mounted on a thin sheet of Al 6061 were measured at room temperature. The gauge resistance was measured as a function of uniaxial loading in the range of 0-300 N. The strain was calculated from the load vs displacement characteristics. of a printed strain gauge sensor in accordance with the various embodiments. The printed strain gauge sensor was printed on PI substrate in a serpentine pattern, similar to that illustrated in FIG. 2C, and printed using the waveform described above. FIG. 12B shows a photograph of the resulting sensor. The metal line width and spacing were close to 100 μm as verified by scanning electron microscopy.

As shown in FIG. 12A, relationship between strain and the change in resistance in the printed strain gauge sensor was substantially linear. Thus, this sensor provided a gauge factor (GF) of 2.22, which is acceptable for practical applications. Notably metal foils typically have GF values between 2 and 5. Accordingly, the GF value and the linear relationship illustrates how the printing process described above is suitable for producing printed strain gauge sensors in accordance with the various embodiments.

Figure 13A:
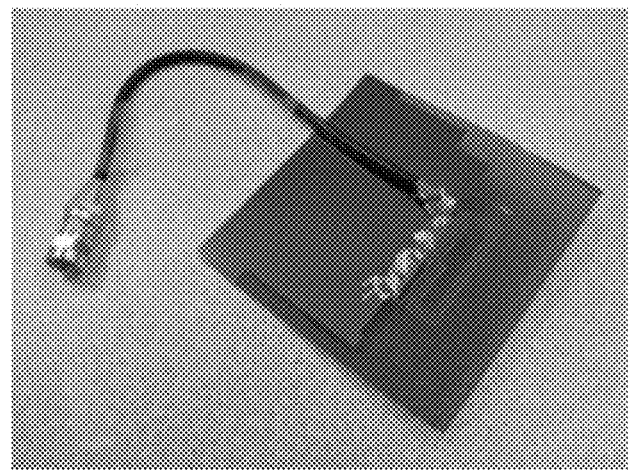
FIGS. 13A and 13B are photographs showing various view of a first antenna design for a wireless sensor in accordance with the various embodiments.
Figure 13B:
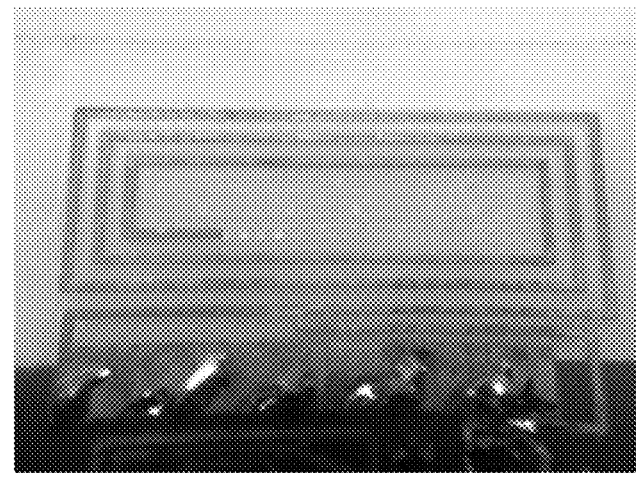

Additionally, performance of an antenna, configured and printed in accordance with the various embodiments, was evaluated. In particular, a first printed antenna design was printed on both FR4 glass-reinforced epoxy laminate substrate and a PI substrate in pattern similar to that illustrated in FIGS. 3A and 3B using the waveform described above. The resulting antenna is shown in FIGS. 13A and 13B. The dimensions of this printed antenna were 28 mm×8.4 mm inverted-F design. At 433 MHz, this first antenna provided better than a −10 dB return loss over 5 MHz bandwidth.

Figure 14B:
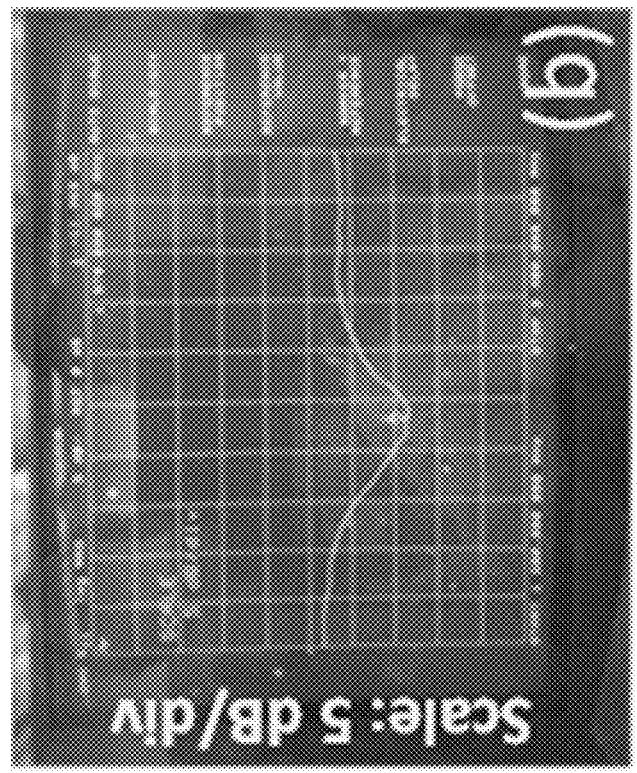
FIG. 14B shows the performance of the antenna of FIG. 14B.
Figure 14A:
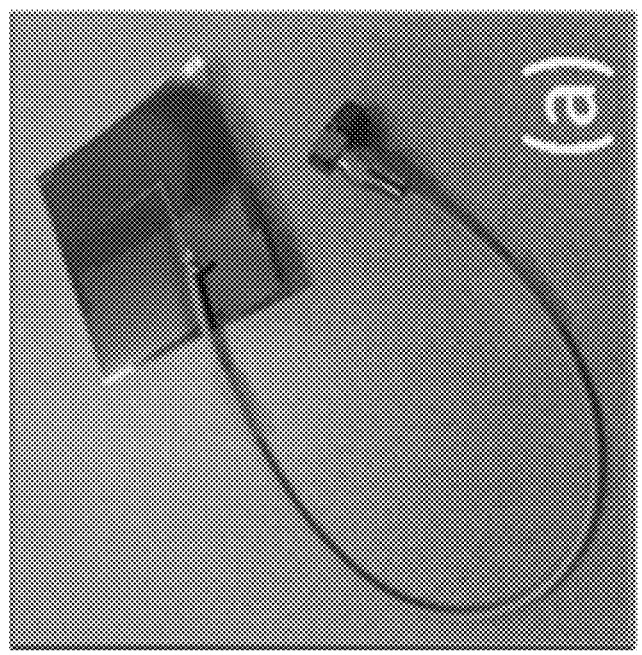
FIG. 14A is a photograph showing a first antenna design for a wireless sensor in accordance with the various embodiments.

A second printed antenna design was printed on PI and FR4 substrates in pattern similar to that illustrated in FIG. 3C using the waveform described above. The resulting antenna is shown in FIG. 14A. The dimensions of this printed antenna were At 2.45 GHz, this second antenna provided better than a return loss below −10 dB, as shown in FIG. 14B.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

What is claimed is:

1. A wireless sensor, comprising:
    a flexible substrate formed of at least one of a paper material and a fabric material having at least one surface that is electrically insulating; and
    a plurality of components disposed on the at least one surface, the plurality of components comprising a communications system, at least one sensor device communicatively coupled to the communications system, and at least one antenna electrically coupled to the communications system;
    wherein each of the at least one sensor device and the at least one antenna is a planar device fabricated using ink during an ink printing process performed by an ink printing machine, the ink defining high conductivity printed metal lines;
    wherein the communications system receives sensor signals from the at least one sensor device, encodes the sensor signals into a bit sequence via code shift keying using a spread spectrum coding, and transmits the bit sequence; and
    wherein the communications system comprises a transmitter power equal to 10 milliwatts and a range of over 5 miles that are at least partially enabled using a pulse thermal processing ("PTP") curing process to cure the high conductivity printed metal lines at a low thermal budget on the flexible substrate with a processing temperature less than or equal to 200° C.

2. The wireless sensor of claim 1, wherein the communications system is configured for performing the encoding by:
    combining at least a portion of the sensor signals into an n-bit word; and
    generating the bit sequence using a linear feedback shift register (LFSR) using the n-bit word as a seed;

wherein a feedback arrangement for the LFSR is selected to provide a Gold code.

3. The wireless sensor of claim 1, wherein the communications system is configured for performing the encoding by:
 combining at least the portion of the sensor signals into a plurality of n-bit words; and
 generating the bit sequence via an exclusive-ORing of the output of a plurality of linear feedback shift registers (LFSRs);
 wherein each of the plurality LFSRs using one of the plurality n-bit words as the seed;
 wherein a feedback arrangement for the plurality of LFSRs is selected to provide a Gold code.

4. The wireless sensor of claim 1, wherein the at least one antenna comprises one of an inverted F-antenna or an L-shaped antenna.

5. The wireless sensor of claim 1, wherein the at least one sensor device comprises at least one of a resistive temperature sensor, a capacitive humidity sensor, or a resistive strain gauge sensor.

6. The wireless sensor of claim 1, wherein each of the at least one sensor device comprises one of an active sensor or a passive sensor.

7. The wireless sensor of claim 1, wherein the at least one sensor device comprises a plurality of printed features.

8. The wireless sensor of claim 7, wherein the plurality of printed features comprise printed lines with a line width between about 1 µm and 100 µm.

9. The wireless sensor of claim 1, wherein the plurality of printed features are disposed over at least two of the at least one surface.

10. The wireless sensor of claim 1, wherein the code shift keying is achieved by:
 encoding a first portion of seed data using a first linear feedback shift register to generate first encoded data;
 encoding a second different portion of the seed data using a second linear feedback shift register to generate second encoded data; and
 combining the first and second encoded data together using an exclusive OR gate to generate the bit sequence.

11. A method of fabricating a sensor device, comprising:
 providing a flexible substrate formed of a paper material or a fabric material having at least one surface that is electrically insulating;
 forming at least one planar sensor and at least one antenna on the flexible substrate using an ink printing machine that performs an ink printing process to print ink on the at least one surface;
 performing a pulse thermal processing ("PTP") curing process to cure the ink;
 mounting one or more discrete components on the at least one surface; and
 electrically coupling a communications system to the at least one planar sensor and the at least one antenna;
 wherein discrete components define at least the communications system for receiving sensor signals from the at least one planar sensor and for transmitting a bit sequence based on the sensor signals via the at least one antenna;
 wherein the communications system comprises a transmitter power equal to 10 milliwatts and a range over 5 miles that are at least partially enabled using the PTP curing process to cure the high conductivity printed metal lines at a low thermal budget on the flexible substrate with a processing temperature less than or equal to 200° C.; and
 wherein the ink printing process is selected so as to limit thermal damage to the flexible substrate.

12. The method of claim 11, wherein the ink printing process comprises an inkjet printing process, a stencil printing process, or screen printing process.

13. The method of claim 12, wherein the ink printing process is configured to provide line widths between about 1 µm and 100 µm.

14. The method of claim 12, wherein the ink printing process comprises a multi-pass printing process, and each pass of the multi-pass printing process is selected to add a width between about 0.1 µm and 10 µm.

15. The method of claim 11, wherein the PTP curing process provides at least one pulse having a peak pulse energy of about 20 kW/cm$^2$ and a pulse width between about 20 microseconds and 20 milliseconds.

16. The method of claim 11, wherein the PTP curing process provides at least one pulse that is ramped up or down using at least one step.

17. The method of claim 11, wherein the PTP curing process comprises applying the at least one pulse using a broadband PTP spectrum source.

18. The method of claim 17, further comprising filtering the broadband PTP spectrum source.

\* \* \* \* \*